United States Patent
Guo et al.

(10) Patent No.: US 9,484,952 B2
(45) Date of Patent: Nov. 1, 2016

(54) CONTEXT STATE AND PROBABILITY INITIALIZATION FOR CONTEXT ADAPTIVE ENTROPY CODING

(71) Applicant: Qualcomm Incorporated, San Diego, CA (US)

(72) Inventors: Liwei Guo, San Diego, CA (US); Xianglin Wang, San Diego, CA (US); Marta Karczewicz, San Diego, CA (US); Joel Sole Rojals, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 861 days.

(21) Appl. No.: 13/665,467

(22) Filed: Oct. 31, 2012

(65) Prior Publication Data

US 2013/0114675 A1   May 9, 2013

Related U.S. Application Data

(60) Provisional application No. 61/555,469, filed on Nov. 3, 2011, provisional application No. 61/556,808, filed on Nov. 7, 2011, provisional application No. 61/557,785, filed on Nov. 9, 2011, provisional application No. 61/560,107, filed on Nov. 15, 2011.

(51) Int. Cl.
*H04N 7/12* (2006.01)
*H04N 11/02* (2006.01)
(Continued)

(52) U.S. Cl.
CPC ........... *H03M 7/4018* (2013.01); *H04N 19/13* (2014.11)

(58) Field of Classification Search
CPC . H04N 7/50; H04N 7/26244; H04N 7/26271
See application file for complete search history.

(56) References Cited

U.S. PATENT DOCUMENTS 7,221,296 B2   5/2007   Ziauddin et al.
7,535,387 B1   5/2009   Delva
(Continued)

FOREIGN PATENT DOCUMENTS

EP   2293580 A1   3/2011
JP   2009516417 A   4/2009
(Continued)

OTHER PUBLICATIONS

Guo, et al., "Non-CE1: 8-bit Initialization for CABAC," Joint Collaborative Team on Video Coding (JCT-VC) of ITU-T SG16 WP3 and ISO/IEC JTC1/SC29/WG11, 7th Meeting: Geneva, Nov. 2011, JCTVC-G837_r3, 7 pp.

(Continued)

*Primary Examiner* — Chikaodili E Anyikire
(74) *Attorney, Agent, or Firm* — Shumaker & Sieffert, P.A.

(57) ABSTRACT

In one example, an apparatus for context adaptive entropy coding may include a coder configured to determine one or more initialization parameters for a context adaptive entropy coding process based on one or more initialization parameter index values. The coder may be further configured to determine one or more initial context states for initializing one or more contexts of the context adaptive entropy coding process based on the initialization parameters. The coder may be still further configured to initialize the contexts based on the initial context states. In some examples, the initialization parameters may be included in one or more tables, wherein, to determine the initialization parameters, the coder may be configured to map the initialization parameter index values to the initialization parameters in the tables. Alternatively, the coder may be configured to calculate the initialization parameters using the initialization parameter index values and one or more formulas.

29 Claims, 8 Drawing Sheets

(51) Int. Cl.
  *H04N 11/04* (2006.01)
  *H03M 7/40* (2006.01)
  *H04N 19/13* (2014.01)

(56) References Cited

U.S. PATENT DOCUMENTS

| | | | |
|---|---|---|---|
| 7,557,740 | B1 | 7/2009 | Hsieh et al. |
| 7,982,641 | B1 | 7/2011 | Su et al. |
| 2005/0012648 | A1 | 1/2005 | Marpe et al. |
| 2007/0110153 | A1* | 5/2007 | Cho ............... H04N 19/176 375/240.12 |
| 2010/0013677 | A1 | 1/2010 | Chan et al. |
| 2010/0098155 | A1 | 4/2010 | Demircin et al. |
| 2011/0135143 | A1 | 6/2011 | Zou et al. |

FOREIGN PATENT DOCUMENTS

| | | |
|---|---|---|
| JP | 2014520451 A | 8/2014 |
| RU | 2336661 | 10/2008 |
| WO | 2007055552 A1 | 5/2007 |
| WO | 2011128268 A1 | 10/2011 |
| WO | 2012172113 A1 | 12/2012 |
| WO | 2012172114 A1 | 12/2012 |

OTHER PUBLICATIONS

Manning, et al., "Foundations of Statistical Natural Language Processing", Jun. 1999, pp. 722. [uploaded in parts].
Marpe, et al., "Unified PIPE-Based Entropy Coding for HEVC", JCT-VC Meeting; MPEG Meeting; Jul. 14-22, 2011; Torino; (Joint Collaborative Team on Video Coding of ISO/IEC JTC1/SC29/WG11 and ITU-T SG.16 );URL:http://wftp3.itu.int/av-arch/jctvc-site/, No. JCTVC-F268, XP030009291, 16 pp.
Tian, et al., "Entropy coders of the H. 264/AVC standard: Algorithms and VLSI Architectures", Springer, Oct. 17, 2010, pp. 193. [uploaded in parts].
Yeo, et al., "Non-CE1: On CABAC context initialization," Joint Collaborative Team on Video Coding (JCT-VC) of ITU-T SG16 WP3 and ISO/IEC JTC1/SC29/WG11, 7th Meeting: Geneva, CH, Nov. 2011, JCTVC-G155, 13 pp.
Wiegand et al., "WD1: Working Draft 1 of High-Efficiency Video Coding", JCTVC-C403, 3rd Meeting: Guangzhou, CN, Oct. 7-15, 2010, 137 pp.
Wiegand et al., "WD2: Working Draft 2 of High-Efficiency Video Coding," JCTVC-D503, Jan. 20-28, 2011, 153 pp.
Wiegand et al., "WD3: Working Draft 3 of High-Efficiency Video Coding," Document JCTVC-E603, 5th Meeting: Geneva, CH, Mar. 16-23, 2011,193 pp.
Bross et al., "WD4: Working Draft 4 of High-Efficiency Video Coding," 6th Meeting: JCTVC-F803_d2, Torino, IT, Jul. 14-22, 2011, 226 pp.
Bross et al., "WD5: Working Draft 5 of High-Efficiency Video Coding," 7th Meeting: Geneva, Switzerland, Nov. 2011, JCTVC-G1103_d2, 214 pp.
Bross et al., "High efficiency video coding (HEVC) text specification draft 6," 7th Meeting: Geneva, CH, Nov. 21-30, 2011, JCTVC-H1003, 259 pp.
Bross et al., "High efficiency video coding (HEVC) text specification draft 7," 9th Meeting: Geneva, CH, Apr. 27-May 7, 2012, JCTVC-I1003_d21, 290 pp.
Bross et al., "High efficiency video coding (HEVC) text specification draft 8," 10th Meeting: Stockholm, SE, Jul. 11-20, 2012, JCTVC-J1003_d7, 261 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Bross, et al., "High Efficiency Video Coding (HEVC) text specification draft 7," JCT-VC Meeting; MPEG Meeting; Apr. 27, 2012-May 7, 2012; Geneva; (Joint Collaborative Team on Video Coding of ISO/IEC JTC1/SC29/WG11 and ITU-T SG.16); URL: http://wftp3.itu.int/av-arch/jctvc-site/, No. JCTVC-I1003_d0, XP030112373, 270 pp.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
Guo, et al., "CE1 B3: 8-bit Linear Initialization for CABAC", JCT-VC Meeting; MPEG Meeting; Feb. 1, 2012-Feb. 10, 2012; San Jose; (Joint Collaborative Team on Video Coding of ISO/IEC JTC1/SC29/WG11 and ITU-T SG.16); URL: http://wftp3.itu.int/av-arch/jctvc-site No. JCTVC-H0535, XP030111562, 7 pp.
International Search Report and Written Opinion—PCT/US2012/063070—ISA/EPO—Feb. 4, 2013, 23 pp.
Marpe, et al.,"Final CABAC Cleanup", JVT Meeting; MPEG Meeting; Dec. 5, 2002-Dec. 13, 2002; Awaji, JP; (Joint Video Team of ISO/IEC JTC1/SC29/WG11 and ITU-T SG.16), No. JVT-F039r1, XP030005609, 24 pp.
Schwarz, et al., "CABAC and Slices", JVT Meeting; Oct. 9, 2002-Oct. 17, 2002; Geneva, CH; (Joint Video Team of ISO/IEC JTC1/SC29/WG11 and ITU-T SG.16), No. JVT-E154, XP030005569, 18 pp.
Wiegand, "Editors Proposed Revision of JVT-E146d37", JVT Meeting; MPEG Meeting; Dec. 9, 2002-Dec. 13, 2002; Awaji, JP;(Joint Video Team of ISO/IEC JTC1/SC29/WG11 and ITU-T SG.16 ) , No. JVT-F082r3, XP030005648, 246 pp. [uploaded in parts].
Bross et al., "High efficiency video coding (HEVC) text specification draft 9," 11th Meeting: Shanghai, CN, Oct. 10-19, 2012, JCTVC-K1003_v7, 290 pp.
Bross et al., "High efficiency video coding (HEVC) text specification draft 10 (For FDIS & Last Call)," 12th Meeting: Geneva, CH, Jan. 14-23, 2013, JCTVC-L1003_v34, 310 pp.
ITU-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.
Response to Written Opinion dated Feb. 4, 2013, from International Application No. PCT/US2012/063070, filed on Aug. 12, 2013, 48 pp.
Second Written Opinion from International Application No. PCT/US2012/063070, dated Feb. 25, 2014, 10 pp.
Response to Second Written Opinion dated Feb. 25, 2013, from International Application No. PCT/US2012/063070, filed on Mar. 6, 2014, 41 pp.
International Preliminary Report on Patentability from International Application No. PCT/US2012/063070, dated Apr. 8, 2014, 18 pp.
Amonou et al., "Description of video coding technology proposal by France Telecom, NTT, NTT DOCOMO, Panasonic and Technicolor," ITU-T SG16 WP3 and ISOIIEC JTCIISC29NVG11, Document JCTVC-A114, Dresden, DE, Apr. 15-23, 2010, 42 pp.
Alshin, et al., "Multi-parameter probability up-date for CABAC," Joint Collaborative Team on Video Coding (JCT-VC) of ITU-T SG16 WP3 and ISO/IEC JTC1/SC29/WG11 6th Meeting: Torino, IT, Jul. 14-22, 2011, JCTVC-F254, 5 pp.
Amonou et al., "Annex A CDCM Video Codec: Decoder Specification," ITU-T SG16 WP3 and ISO/IEC JTCI/SC29NVG11, Document JCTVC-A114-Annex A, Dresden, DE, Apr. 15-23, 2010, 106 pp.
Amonou et al., "Annex B CDCM Video Codec: Reference Encoding Model" ITU-T SG16 WP3 and ISO/IEC JTCI/SC29NVG11, Document JCTVC-A114-Annex B, Dresden, DE, Apr. 15-23, 2010, 46 pp.
Amonou et al., "Annex C CDCM Video Code: User's Manual" ITU-T SG16 WP3 and ISO/IEC JTCI/SC29NVG11, Document JCTVC-A114-Annex C, Dresden, DE, Apr. 15-23, 2010, 53 pp.
Amonou et al., "Appendix 1: Other supported features" ITU-T SG16 WP3 and ISO/IEC JTC1/SC29NVG11, Document JCTVC-A114—Appendix 1, Dresden, DE, Apr. 15-23, 2010, 4 pp.
Amonou et al., "Description of video coding technology proposal by France Telecom, NTT, NTT DOCOMO, Panasonic and Technicolor" ITU-T SG16 WP3 and ISO/IEC JTCI/SC29NVG11, Document JCTVC-A114 meeting, Dresden, DE, Apr. 15-23, 2010, 30 slides.

(56) References Cited

OTHER PUBLICATIONS

Alshina, et al., "Multi-parameter probability up-date for CABAC," Joint Collaborative Team on Video Coding (JCTVC) of ITU-T SG16 WP3 and ISO/IEC JTC1/SC29/WG11 6th Meeting: Torino, IT, Jul. 14-22, 2011, JCTVC-F254, 7 pp.

Notice of Grounds for Rejection from counterpart Korean Application No. 2014-7014741, dated Jan. 7, 2016, 3 pp.
First Office Action from counterpart Japanese Application No. 2014-540089, dated Apr. 18, 2015, 5 pp.
First Office Action from counterpart Japanese Application No. 2014-540089, dated Sep. 8, 2015, 4 pp.

\* cited by examiner

CONTEXT STATE AND PROBABILITY INITIALIZATION FOR CONTEXT ADAPTIVE ENTROPY CODING

This application claims the benefit of U.S. Provisional Application No. 61/555,469, filed Nov. 3, 2011, U.S. Provisional Application No. 61/556,808, filed Nov. 7, 2011, U.S. Provisional Application No. 61/557,785, filed Nov. 9, 2011, and U.S. Provisional Application No. 61/560,107, filed Nov. 15, 2011, the entire contents of each of which are incorporated herein by reference.

TECHNICAL FIELD

This disclosure relates to entropy coding of video data or the like, and more particularly, to context adaptive entropy coding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

This disclosure describes techniques for coding data, such as video data. For example, the techniques may be used to code video data, such as residual transform coefficients and/or other syntax elements, generated by video coding processes. In particular, the disclosure describes techniques that may promote efficient coding of video data using context adaptive entropy coding processes. The disclosure describes video coding for purposes of illustration only. As such, the techniques described in this disclosure may be applicable to coding other types of data.

As one example, the techniques of this disclosure may enable a coding system or device to code various types of data, such as, e.g., video data, more efficiently than when using other techniques. In particular, the techniques described herein may enable the coding system or device to have lower complexity relative to other systems or devices when coding the data using a context adaptive entropy coding process, such as, e.g., a context adaptive binary arithmetic coding (CABAC) process. For example, the techniques may reduce an amount of information stored within the coding system or device and/or transmitted to or from the coding system or device, for purposes of initializing one or more contexts of the context adaptive entropy coding process. As one example, the amount of information may be reduced by storing and/or transmitting initialization parameter index values that indicate initialization parameters used to initialize the contexts, rather than storing and/or transmitting the initialization parameters directly.

Additionally, as another example, the techniques may improve compression of the data when the coding system or device is configured to code the data using the context adaptive entropy coding process. For example, the techniques may improve the compression of the data by enabling the coding system or device to initialize one or more contexts of the context adaptive entropy coding process, such that the contexts include relatively more accurate initial probabilities compared to initial probabilities determined using other context initialization techniques. In particular, the contexts may be initialized based on temporal layer information associated with the data, using reference context state and quantization parameter information and various relationships, or using one or more probability offsets. Additionally, the techniques may further improve the compression of the data by enabling the coding system or coding device to subsequently update the probabilities of the contexts, such that the updated probabilities are relatively more accurate compared to probabilities updated using other context probability update techniques, using the same or similar techniques as those described above.

In one example, a method of context adaptive entropy coding may include determining one or more initialization parameters for a context adaptive entropy coding process based on one or more initialization parameter index values. The method may also include determining one or more initial context states for initializing one or more contexts of the context adaptive entropy coding process based on the one or more initialization parameters. In addition, the method may include initializing the one or more contexts of the context adaptive entropy coding process based on the one or more initial context states.

In another example, an apparatus for context adaptive entropy coding may include a coder. In this example, the coder may be configured to determine one or more initialization parameters for a context adaptive entropy coding process based on one or more initialization parameter index values. The coder may be further configured to determine one or more initial context states for initializing one or more contexts of the context adaptive entropy coding process based on the one or more initialization parameters. The coder may be still further configured to initialize the one or more contexts of the context adaptive entropy coding process based on the one or more initial context states.

In still another example, a device for context adaptive entropy coding may include means for determining one or more initialization parameters for a context adaptive entropy coding process based on one or more initialization parameter index values. The device may further include means for determining one or more initial context states for initializing one or more contexts of the context adaptive entropy coding process based on the one or more initialization parameters. The device may still further include means for initializing the one or more contexts of the context adaptive entropy coding process based on the one or more initial context states.

The techniques described in this disclosure may be implemented in hardware, software, firmware, or any combination thereof. If implemented in hardware, an apparatus may be realized as one or more integrated circuits, one or more processors, discrete logic, or any combination thereof. If implemented in software, the software may be executed in one or more processors, such as one or more microprocessors, application specific integrated circuits (ASICs), field programmable gate arrays (FPGAs), or digital signal processors (DSPs). The software that executes the techniques may be initially stored in a tangible or non-transitory computer-readable storage medium and loaded and executed in the one or more processors.

Accordingly, this disclosure also contemplates a non-transitory computer-readable storage medium having stored thereon instructions that upon execution may cause one or more processors to perform context adaptive entropy coding. In this example, the instructions may cause the one or more processors to determine one or more initialization parameters for a context adaptive entropy coding process based on one or more initialization parameter index values. The instructions may further cause the one or more processors to determine one or more initial context states for initializing one or more contexts of the context adaptive entropy coding process based on the one or more initialization parameters. The instructions may still further cause the one or more processors to initialize the one or more contexts of the context adaptive entropy coding process based on the one or more initial context states.

The details of one or more examples are set forth in the accompanying drawings and the description below. Other features, objects, and advantages will be apparent from the description and drawings, and from the claims.

DETAILED DESCRIPTION

Figure 1:
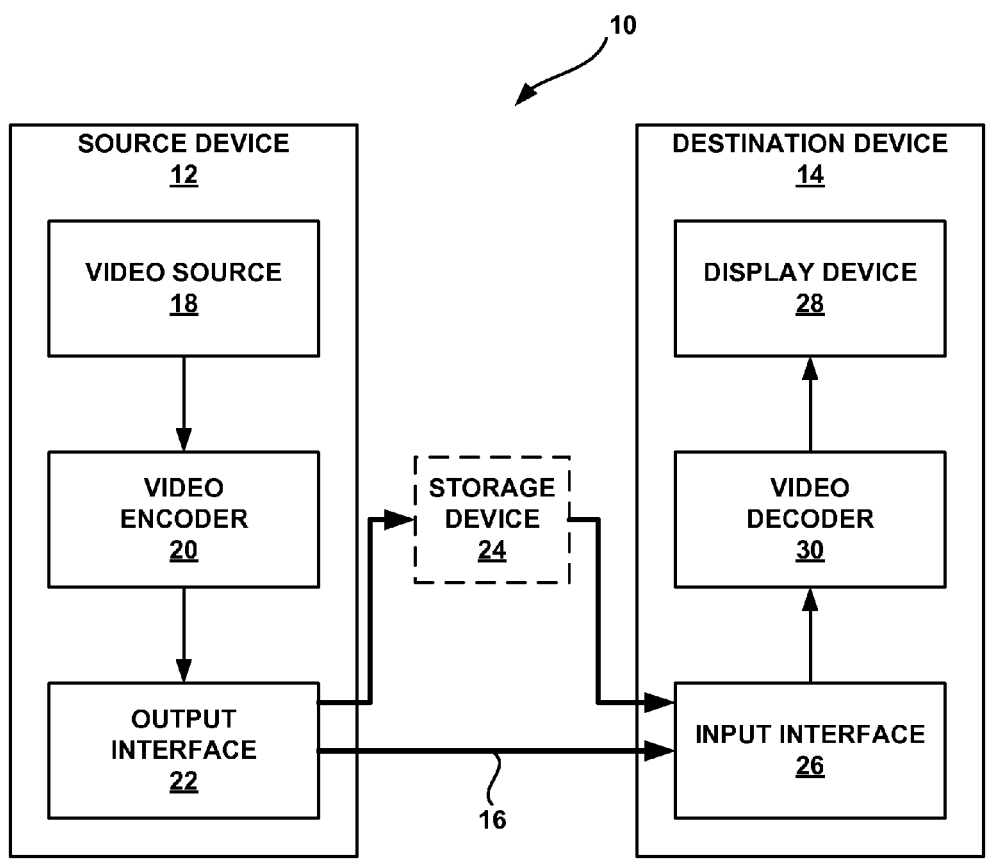
FIG. 1 is a block diagram illustrating an example of a video encoding and decoding system that may implement techniques for context state and probability initialization for context adaptive entropy coding, consistent with the techniques of this disclosure.

This disclosure describes techniques for coding data, such as video data. For example, the techniques may be used to code video data, such as residual transform coefficients and/or other syntax elements, generated by video coding processes. In particular, the disclosure describes techniques that may promote efficient coding of video data using context adaptive entropy coding processes. The disclosure describes video coding for purposes of illustration only. As such, the techniques described in this disclosure may be applicable to coding other types of data.

In this disclosure, the term "coding" refers to encoding that occurs at an encoder or decoding that occurs at a decoder. Similarly, the term "coder" refers to an encoder, a decoder, or a combined encoder/decoder (e.g., "CODEC"). The terms coder, encoder, decoder, and CODEC all refer to specific machines designed for the coding (i.e., encoding and/or decoding) of data, such as, video data, consistent with this disclosure.

As one example, the techniques of this disclosure may enable a coding system or device to code various types of data, such as, e.g., video data, more efficiently than when using other techniques. In particular, the techniques described herein may enable the coding system or device to have lower complexity relative to other systems or devices when coding the data using a context adaptive entropy coding process, such as, e.g., a context adaptive binary arithmetic coding (CABAC) process. For example, the techniques may reduce an amount of information stored within the coding system or device and/or transmitted to or from the coding system or device, for purposes of initializing one or more contexts of the context adaptive entropy coding process. As one example, the amount of information may be reduced by storing and/or transmitting initialization parameter index values that indicate initialization parameters used to initialize the contexts, rather than storing and/or transmitting the initialization parameters directly.

Additionally, as another example, the techniques may improve compression of the data when the coding system or device is configured to code the data using the context adaptive entropy coding process. For example, the techniques may improve the compression of the data by enabling the coding system or device to initialize one or more contexts of the context adaptive entropy coding process, such that the contexts include relatively more accurate initial probabilities compared to initial probabilities determined using other context initialization techniques. In particular, the contexts may be initialized based on temporal layer information associated with the data, using reference context state and quantization parameter information and various relationships, or using one or more probability offsets. Additionally, the techniques may further improve the compression of the data by enabling the coding system or device to subsequently update the probabilities of the contexts, such that the updated probabilities are relatively more accurate compared to probabilities updated using other context probability update techniques, using the same or similar techniques as those described above.

Accordingly, there may be a relative bit savings for a coded bitstream that includes the coded data, as well as other syntax information (e.g., the initialization parameter index values) transmitted to or from the coding system or device, and a relative reduction in complexity of the coding system or device used to code the data, when using the techniques of this disclosure.

The techniques of this disclosure may, in some examples, be used with any context adaptive entropy coding methodology, including context adaptive variable length coding (CAVLC), CABAC, syntax-based context-adaptive binary arithmetic coding (SBAC), Probability Interval Partitioning Entropy (PIPE) coding, or another context adaptive entropy coding methodology. CABAC is described herein for purposes of illustration only, and without limitation as to the techniques broadly described in this disclosure. Also, the techniques described herein may be applied to coding of other types of data generally, e.g., in addition to video data.

FIG. 1 is a block diagram illustrating an example of a video encoding and decoding system that may implement techniques for context state and probability initialization for context adaptive entropy coding, consistent with the techniques of this disclosure. As shown in FIG. 1, system 10 includes a source device 12 that generates encoded video data to be decoded at a later time by a destination device 14. Source device 12 and destination device 14 may comprise any of a wide range of devices, including desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or the like. In some cases, source device 12 and destination device 14 may be equipped for wireless communication.

Destination device 14 may receive the encoded video data to be decoded via a link 16. Link 16 may comprise any type of medium or device capable of moving the encoded video data from source device 12 to destination device 14. In one example, link 16 may comprise a communication medium to enable source device 12 to transmit encoded video data directly to destination device 14 in real-time. The encoded video data may be modulated according to a communication standard, such as a wireless communication protocol, and transmitted to destination device 14. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

Alternatively, encoded video data may be output from output interface 22 to a storage device 24. Similarly, encoded video data may be accessed from storage device 24 by input interface 26. Storage device 24 may include any of a variety of distributed or locally accessed data storage media such as a hard drive, Blu-ray discs, DVDs, CD-ROMs, flash memory, volatile or non-volatile memory, or any other suitable digital storage media for storing encoded video data. In a further example, storage device 24 may correspond to a file server or another intermediate storage device that may hold the encoded video generated by source device 12. Destination device 14 may access stored video data from storage device 24 via streaming or download. The file server may be any type of server capable of storing encoded video data and transmitting that encoded video data to destination device 14. Example file servers include a web server (e.g., for a website), an FTP server, network attached storage (NAS) devices, or a local disk drive. Destination device 14 may access the encoded video data through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server. The transmission of encoded video data from storage device 24 may be a streaming transmission, a download transmission, or a combination of both.

The techniques of this disclosure are not necessarily limited to wireless applications or settings. The techniques may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes a video source 18, video encoder 20, and an output interface 22. In some cases, output interface 22 may include a modulator/demodulator (modem) and/or a transmitter. In source device 12, video source 18 may include a source such as a video capture device, e.g., a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications.

The captured, pre-captured, or computer-generated video may be encoded by video encoder 20. The encoded video data may be transmitted directly to destination device 14 via output interface 22 of source device 12. The encoded video data may also (or alternatively) be stored onto storage device 24 for later access by destination device 14 or other devices, for decoding and/or playback.

Destination device 14 includes an input interface 26, a video decoder 30, and a display device 28. In some cases, input interface 26 may include a receiver and/or a modem. Input interface 26 of destination device 14 receives the encoded video data over link 16, or from storage device 24. The encoded video data communicated over link 16, or provided on storage device 24, may include a variety of syntax elements generated by video encoder 20 for use by a video decoder, such as video decoder 30, in decoding the video data. Such syntax elements may be included with the encoded video data transmitted on a communication medium, stored on a storage medium, or stored on a file server.

Display device 28 may be integrated with, or be external to, destination device 14. In some examples, destination device 14 may include an integrated display device, such as, e.g., display device 28, and/or be configured to interface with an external display device. In other examples, destination device 14 may itself be a display device. In general, display device 28 displays the decoded video data to a user, and may comprise any of a variety of display devices, such as a liquid crystal display (LCD), a plasma display, an organic light emitting diode (OLED) display, or another type of display device.

Video encoder 20 and video decoder 30 may operate according to a video compression standard, such as the High Efficiency Video Coding (HEVC) standard presently under development by the Joint Collaboration Team on Video Coding (JCT-VC) of ITU-T Video Coding Experts Group (VCEG) and ISO/IEC Motion Picture Experts Group (MPEG), and may conform to the HEVC Test Model (HM). Alternatively, video encoder 20 and video decoder 30 may operate according to other proprietary or industry standards, such as the ITU-T H.264 standard, alternatively referred to as MPEG-4, Part 10, Advanced Video Coding (AVC) (hereinafter, H.264/AVC), or extensions of such standards. The techniques of this disclosure, however, are not limited to any particular coding standard. Other examples of video compression standards include MPEG-2 and ITU-T H.263. A recent draft of the HEVC standard, referred to as "HEVC Working Draft 8" or "WD8," is described in document JCTVC-J1003_d7, Bross et al., "High efficiency video coding (HEVC) text specification draft 8," Joint Collaborative Team on Video Coding (JCT-VC) of ITU-T SG16 WP3 and ISO/IEC JTC1/SC29/WG11, 10th Meeting: Stockholm, SE, 11-20 Jul. 2012.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, the MUX-DEMUX units may conform to the ITU H.223 multiplexer protocol, or other protocols such as the user datagram protocol (UDP).

Video encoder 20 and video decoder 30 each may be implemented as any of a variety of suitable encoder or decoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable storage medium and execute the instructions in hardware using one or more processors to perform the techniques of this disclosure. Each of video encoder 20 and video decoder 30 may be included in one or more encoders or decoders, either of which may be integrated as part of a combined encoder/decoder (e.g., CODEC) in a respective device.

The HEVC standardization efforts are based on an evolving model of a video coding device referred to as the HEVC Test Model (HM). The HM presumes several additional capabilities of video coding devices relative to existing devices according to, e.g., ITU-T H.264/AVC. For example, whereas H.264 provides nine intra-prediction encoding modes, the HM may provide as many as thirty-five intra-prediction encoding modes.

In general, the working model of the HM describes that a video frame or picture may be divided into a sequence of treeblocks or largest coding units (LCU) that include both luma and chroma samples. A treeblock has a similar purpose as a macroblock of the H.264 standard. A slice includes a number of consecutive treeblocks in coding order. A video frame or picture may be partitioned into one or more slices. Each treeblock may be split into coding units (CUs) according to a quadtree. For example, a treeblock, as a root node of the quadtree, may be split into four child nodes, and each child node may in turn be a parent node and be split into another four child nodes. A final, unsplit child node, as a leaf node of the quadtree, comprises a coding node, i.e., a coded video block. Syntax data associated with a coded bitstream may define a maximum number of times a treeblock may be split, and may also define a minimum size of the coding nodes.

A CU includes a coding node and prediction units (PUs) and transform units (TUs) associated with the coding node. A size of the CU corresponds to a size of the coding node and may be square in shape. The size of the CU may range from 8×8 pixels up to the size of the treeblock with a maximum of 64×64 pixels or greater. Each CU may contain one or more PUs and one or more TUs. Syntax data associated with a CU may describe, for example, partitioning of the CU into one or more PUs. Partitioning modes may differ between whether the CU is skip- or direct-mode encoded, intra-prediction mode-encoded, or inter-prediction mode-encoded. PUs may be partitioned to be non-square in shape. Syntax data associated with a CU may also describe, for example, partitioning of the CU into one or more TUs according to a quadtree. A TU can be square or non-square in shape.

The HEVC standard performs transforms according to TUs, which may be different for different CUs. The TUs are typically sized based on the size of PUs within a given CU defined for a partitioned LCU, although this may not always be the case. The TUs are typically the same size or smaller than the PUs. In some examples, residual samples corresponding to a CU may be subdivided into smaller units using a quadtree structure known as "residual quad tree" (RQT). The leaf nodes of the RQT may be referred to as transform units (TUs). Pixel difference values associated with the TUs may be transformed to produce transform coefficients, which may be quantized.

In general, a PU includes data related to the prediction process. For example, when the PU is intra-mode encoded, the PU may include data describing an intra-prediction mode for the PU. As another example, when the PU is inter-mode encoded, the PU may include data defining a motion vector for the PU. The data defining the motion vector for a PU may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list (e.g., List 0, List 1, or List C) for the motion vector.

In general, a TU is used for the transform and quantization processes. A given CU having one or more PUs may also include one or more TUs. Following prediction, video encoder 20 may calculate residual values corresponding to the PU. The residual values comprise pixel difference values that may be transformed into transform coefficients, quantized, and scanned using the TUs to produce serialized transform coefficients for entropy coding. This disclosure typically uses the term "video block" to refer to a coding node of a CU. In some specific cases, this disclosure may also use the term "video block" to refer to a treeblock, i.e., LCU, or a CU, which includes a coding node and PUs and TUs.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may correspond to a coding node within a CU. The video blocks may have fixed or varying sizes, and may differ in size according to a specified coding standard.

As an example, the HM supports prediction in various PU sizes. Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a non-negative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

Following intra-predictive or inter-predictive coding using the PUs of a CU, video encoder 20 may calculate residual data for the TUs of the CU. The PUs may comprise pixel data in the spatial domain (also referred to as the "pixel domain") and the TUs may comprise coefficients in the transform domain following application of a transform, e.g., a discrete cosine transform (DCT), an integer transform, a wavelet transform, or a conceptually similar transform, to residual video data. The residual data may correspond to pixel differences between pixels of the unencoded picture and prediction values corresponding to the PUs. Video encoder 20 may form the TUs including the residual data for the CU, and then transform the TUs to produce transform coefficients for the CU.

Following any transforms to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m.

In some examples, video encoder 20 may use one or more predefined scanning order to scan the quantized transform coefficients to produce a serialized vector that can be entropy encoded. The predefined scanning orders may vary based on factors such as the coding mode or transform size or shape used in the coding process. Furthermore, in other examples, video encoder 20 may perform an adaptive scan, e.g., using a scanning order that is periodically adapted. The scanning order may adapt differently for different blocks, e.g., based on the coding mode or other factors. In any case, after scanning the quantized transform coefficients to form the serialized "one-dimensional" vector, video encoder 20 may further entropy encode the one-dimensional vector, e.g., according to CAVLC, CABAC, SBAC, PIPE, or another context adaptive entropy encoding methodology. Video encoder 20 may also entropy encode other syntax elements associated with the encoded video data for use by video decoder 30 in decoding the video data. Furthermore, video decoder 30 may perform the same or similar context adaptive entropy coding techniques as video encoder 20, to decode the encoded video data and any additional syntax elements associated with the video data.

As one example, to perform CABAC, video encoder 20 may assign a context within a context model to a symbol to be transmitted. The context may relate to, for example, whether neighboring values of the symbol are non-zero or not. As another example, to perform CAVLC, video encoder 20 may select a variable length code for a symbol to be transmitted. Codewords in CAVLC, and variable length coding, generally, may be constructed such that relatively shorter codes correspond to more probable symbols, while relatively longer codes correspond to less probable symbols. In this manner, the use of CAVLC may achieve a bit savings over, for example, using equal-length codewords for each symbol to be transmitted. The probability determination may be based on a context assigned to the symbol. Additionally, the techniques described above are equally applicable to video decoder 30 used to decode one or more symbols encoded by video encoder 20 in the manner described above.

In general, according to the techniques of H.264/AVC and certain draft versions of HEVC described above, coding a data symbol (e.g., a syntax element, or a part of a syntax element, for a coded block of video data) using CABAC may involve the following steps:

(1) Binarization: If a symbol to be coded is non-binary valued, it is mapped to a sequence of so-called "bins." Each bin can have a value of "0" or "1."

(2) Context Assignment: Each bin (e.g., in a so-called "regular" coding mode) is assigned to a context. A context model determines how a context is calculated for (e.g., assigned to) a given bin based on information available for the bin, such as values of previously encoded symbols, or bin number (e.g., a position of the bin within a sequence of bins that includes the bin).

(3) Bin encoding: Bins are encoded with an arithmetic encoder. To encode a given bin, the arithmetic encoder requires as an input a probability (e.g., an estimated probability) of a value of the bin, i.e., the probability that the bin value is equal to "0," and the probability that the bin value is equal to "1." For example, a context assigned to the bin, as described above in step (2), may indicate this probability of the bin value. As one example, a probability of each context (e.g., an estimated probability indicated by each context) may be represented by an integer value associated with the context called a context "state." Each context has a context state (e.g., a particular context state at any given time). As such, a context state (i.e., an estimated probability) is the same for bins assigned to one context, and differs between contexts (e.g., varies among different contexts, and, in some cases, for a given context over time). Additionally, to encode the bin, the arithmetic encoder further requires as an input the bin value, as described above.

(4) State update: The probability (e.g., the context state) for a selected context is updated based on the actual coded value of the bin. For example, if the bin value was "1," the probability of "1s" is increased, and if the bin value was "0," the probability of "0s" is increased, for the selected context.

Many aspects of this disclosure are described specifically in the context of CABAC. Additionally, PIPE, CAVLC, SBAC or other context adaptive entropy coding techniques may use similar principles as those described herein with reference to CABAC. In particular, these or other context adaptive entropy coding techniques may utilize context state initialization, and can therefore also benefit from the techniques of this disclosure.

Furthermore, as described above, the CABAC techniques of H.264/AVC include the use context states, wherein each context state is implicitly related to a probability. There exist variants of CABAC in which a probability (e.g., "0" or "1") of a given symbol being coded is used directly, i.e., the probability (or an integer version of the probability) is the context state itself, as will be described in greater detail below.

Before initiating a CABAC encoding or decoding process, an initial context state may need to be assigned to each context of the CABAC process. In H.264/AVC and certain draft versions of HEVC, a linear relationship, or "model," is used to assign initial context states for each context. Specifically, for each context, there are pre-defined initialization parameters, slope ("m") and intersection ("n"), used to determine the initial context state for the context. For example, according to H.264/AVC and certain draft versions of HEVC, an initial context state for a given context may be derived using the following relationships:

$$\text{Int } i\text{InitState}=((m*iQp)/16)+n; \qquad \text{EQ. (1)}$$

$$i\text{InitState}=\min(\max(1,i\text{InitState}),126). \qquad \text{EQ. (2)}$$

In equation EQ. (1), "m" and "n" correspond to initialization parameters for the context being initialized (i.e., for the initial context state "iInitState" being determined for the context). Furthermore, "iQP," which may be referred to as an initialization quantization parameter (QP), may correspond to a QP for the data (e.g., a block of video data) being coded. The value of the QP for the data, and thus the value of iQP, may be set, for example, on a frame-by-frame, slice-by-slice, or block-by-block basis. Additionally, the values of the "m" and "n" initialization parameters may vary for different contexts. Furthermore, equation EQ. (2) may be referred to as a "clipping" function, which may be used to assure that the value of "iInitState" ranges between "1" and "126," thereby allowing the value to be represented using 7 bits of data.

In some examples, "iInitState" may be further converted into an actual context state of the context in CABAC, plus a "most probable symbol (MPS)/least probable symbol (LPS)" symbol, using the following expressions:

```
if (iInitState >= 64)
{
    m_ucState   = min(62, iInitState - 64);
    m_ucState   += m_ucState + 1;
}
Else
{
    m_ucState   = min(62, 63 - iInitState);
    m_ucState   += m_ucState;
}
``` where "m_ucState" corresponds to the actual context state of the context in CABAC plus the MPS/LPS symbol.

In some examples of CABAC, in cases where a context state for a context directly corresponds to a probability of the context, as described above, the following relationships may be used to initialize a particular context:

$$\text{Int } c=\text{asCtxInit}[0]+\text{asCtxInit}[1]*(iQp-iQP\text{reper}); \qquad \text{EQ. (3)}$$

$$iP0=\min(\max(1,c),32767). \qquad \text{EQ. (4)}$$

The value "iP0" may indicate a probability of a symbol being coded, as directly indicated by context state "c" for a given context. Accordingly, in this example, there is no need to convert the probability of the symbol "iP0" to MPS and LPS symbols and an actual context state, as described above. Moreover, as shown, the relationship, or "model," of EQ. (3) is also linear, and relies on two initialization parameters, namely, "asCtxInit[0]" and "asCtxInit[1]." For example, "iQP" may once again correspond to the QP for the data being coded. Additionally, "iQPreper" may correspond to a constant, such as an offset, used to modify iQp, in some examples.

In the above-described example, the probability of the symbol iP0 is expressed as an integer using 15 bits of data, where a minimum non-zero probability is "1," and a maximum probability is "32767." In this example, an "actual" probability is derived using the expression "iP0/32768." Additionally, equation EQ. (4) also may be referred to as a "clipping" function, and may be used to assure that the value of "iP0" ranges between "1" and "32767," thereby allowing the value to be represented using 15 bits of data.

The approach described above has several drawbacks. As one example, because the CABAC process described above with reference to H.264/AVC and certain draft versions of HEVC includes a significant number of contexts (e.g., as many as 369 contexts), each context may be initialized using a particular set, or "pair" of "m" and "n" initialization parameters. As a result, a significant number of "m" and "n" initialization parameters (e.g., as many as 369 different pairs of "m" and "n" initialization parameters), may be used to determine the initial context states for the contexts. Moreover, because each of the "m" and "n" initialization parameters may be represented using as many as 8 bits of data, a significant amount of information (e.g., a number of bits of data) may be required to store and/or transmit the "m" and "n" initialization parameters for purposes of determining the initial context states for the contexts. For example, as many as 5,904 bits of data may be required to store and/or transmit 369 different pairs of "m" and "n" initialization parameters, each comprising 16 bits of data (i.e., each of the "m" and "n" initialization parameters of a particular pair comprising 8 bits of data).

Additionally, as another example, the linear relationship used to determine the initial context states for the contexts, as also described above with reference to H.264/AVC and certain draft versions of HEVC, may result in determining initial probabilities of the contexts, as indicated by the initial context states, that are relatively less accurate than initial probabilities determined using other techniques. As one example, using the linear relationship described above may result in the initial probabilities being relatively less accurate than initial probabilities determined using a linear relationship that further takes into account a temporal layer associated with the data (e.g., video data) being coded. As another example, using the linear relationship described above may result in the initial probabilities being relatively less accurate than initial probabilities determined using a non-linear, a partially non-linear, or a bi-linear relationship. As yet another example, in cases where the initial probabilities of the contexts are determined directly (i.e., rather than determining initial context states that indicate the initial probabilities of the contexts), the initial probabilities may be relatively less accurate (e.g., skewed) compared to initial probabilities that are further adjusted based on their proximity to one or more of an upper bound and a lower bound of a probability range that includes the initial probabilities.

This disclosure describes several techniques that may, in some cases, reduce or eliminate some of the drawbacks described above with reference to context state initialization (i.e., determining initial context states for contexts, wherein the initial context states indicate initial probabilities of the contexts), and probability initialization (i.e., directly determining initial probabilities of contexts) of a context adaptive entropy coding process. In particular, the techniques described herein may enable context adaptive entropy coding (e.g., CABAC, CAVLC, SBAC, PIPE, etc.) systems or devices used to code data, such as, e.g., video data, to have lower complexity relative to other systems or devices. As one example, the techniques of this disclosure may enable the systems or devices to store and/or transmit initialization parameter index values that indicate initialization parameters "m" and "n" described above, which are used to determine initial context states for contexts of a context adaptive entropy coding process, rather than storing and/or transmitting the initialization parameters directly. In this example, the initialization parameter index values may be represented using less information (e.g., fewer bits of data) than the initialization parameters, possibly resulting in a reduced amount of information stored within the systems or devices, and, in some cases, transmitted from the systems to other systems or devices.

Additionally, the techniques described herein may enable more efficient context adaptive entropy coding of data, such as, e.g., video data, by initializing one or more contexts of a context adaptive entropy coding process such that initial probabilities of the contexts are more accurate relative to initial probabilities derived using other techniques. In one example, the techniques of this disclosure may enable initializing the contexts so as to have the relatively more accurate initial probabilities by determining initial context states, which are indicative of the initial probabilities, for the contexts, based on a temporal layer associated with the data. In another example, the techniques may enable initializing the one or more contexts by determining the initial context states for the contexts using reference context states and corresponding reference quantization parameter values. In yet another example, in cases where the initial probabilities of the contexts are determined directly, the techniques may enable determining the initial probabilities based on one or more probability offsets.

As one example, this disclosure describes techniques for determining one or more initialization parameters for a context adaptive entropy coding process based on one or more initialization parameter index values, determining one or more initial context states for initializing one or more contexts of the context adaptive entropy coding process based on the one or more initialization parameters, and initializing the one or more contexts of the context adaptive entropy coding process based on the one or more initial context states.

For example, the development of the techniques of this disclosure has demonstrated that, in some cases, using the linear relationship between the initial context states and the QP of the data (e.g., video data) being coded, as described above with reference to H.264/AVC and HEVC, may result in relatively less accurate initial probabilities of the contexts compared to using other techniques. As a result, the initial probabilities indicated by the initial context states may be substantially different from actual probabilities of the data being coded. Accordingly, as will be described in greater detail below, this disclosure proposes several methods of generating, or determining initialization values (i.e., initial context states, or initial probabilities directly) for the contexts to improve the accuracy of the so-called initial "state/probability estimates" (i.e., the probabilities) of the contexts. Additionally, this disclosure also proposes techniques for reducing a bit-width of the linear model initialization parameters (i.e., "m" and "n") described above, such that storage for an initialization table (e.g., a size of the table) that includes initialization information for the contexts (e.g., the "m" and "n" initialization parameters) may be reduced.

For example, in HM, the "m" and "n" initialization parameters described above are stored using 16-bit signed integers. As such, 16 bits of data are used for storing each "m" and "n" initialization parameter. Because the techniques of H.264/AVC and certain draft versions of HEVC may include as many as 369 contexts, as many as 369 sets, or "pairs" of "m" and "n" initialization parameters (e.g., 369 "(m,n)" pairs) may be stored within a particular coder, thereby consuming a substantially large amount of memory, or storage.

In some examples, this disclosure describes using 4 bits of data for each of the "m" and "n" initialization parameters. To cover a sufficiently large range of slope ("m") and intersection ("n") values, instead of directly using "m" to represent slope, and "n" to represent intersection, the disclosed techniques propose using "m" to represent a slope index, and "n" to represent an intersection index. In this example, an actual slope value can be derived using the "m" initialization parameter index value using the following relationship (i.e., using a slope table):

Slope=SlopeTable[m]

Similarly, an actual intersection value can be derived using the "n" initialization parameter index value using the following relationship (i.e., using an intersection table):

Intersection=IntersectionTable[n]

In other words, according to the disclosed techniques, the "m" and "n" initialization parameters described above with reference to H.264/AVC and HEVC may be redefined as "m" and "n" initialization parameter index values that, in turn, indicate the initialization parameters (which may be referred to as simply "slope" and "intersection" initialization parameters). In other examples, however, the "m" and "n" initialization parameters of H.264/AVC and HEVC may retain their original meaning, while the initialization parameter index values of the techniques disclosed herein may be referred to as "idx_m" and "idx_n" initialization parameter index values. In the following examples, the initialization parameter index values are referred to as "m" and "n" initialization parameter index values.

An example of a slope table and an intersection table that includes the slope and intersection values, respectively, determined using the "m" and "n" initialization parameter index values are shown below:

SlopeTable[16]={−46, −39, −33, −28, −21, −14, −11, −6, 0, 7, 12, 17, 21, 26, 34, 40}

IntersectionTable[16]={−42, −25, −11, 0, 9, 20, 32, 43, 54, 63, 71, 79, 92, 104, 114, 132}

In some examples, the 4-bit "m" and 4-bit "n" initialization parameter index values can be combined using an 8-bit parameter "x," where "m=x>>4 and n=x&15," or vice versa, "n=x>>4 and m=x&15," can be used to derive "m" and "n" using "x." In this example, ">>" indicates a right shift operation, and "&" indicates a logic AND operation.

In other examples, it is also possible to use unequal numbers of bits to represent the "m" and "n" initialization parameter index values. For example, 5 bits of data may be used to represent "m," and 3 bits of data may be used to represent "n," or vice versa.

In still other examples, instead of storing a table of the slope and intersection values, as described above, the slope and intersection values can be calculated from the corresponding slope or intersection index value using one or more formulas, or functions, such as the following slope and/or intersection functions:

Slope=function$A(m)$ and/or Intersection=function$B(n)$

Using the slope as an example, the slope function can be a linear function, such as, e.g., the following expression:

slope=$c0*m+c1$ where "c0" and "c1" are parameters of the linear function.

In another example, the slope function can include only shift and add operations, such as, e.g., the following expression:

slope=$m<<k+c1$ where "k" is a shift parameter and "c1" is a constant.

As an additional example, for the following tables:

SlopeTable[16]={−45−40−35−30−25−20−15−10−50 5 10 15 20 25 30}

IntersectionTable[16]={−16−8 0 8 16 24 32 40 48 56 64 72 80 88 96 104}, the following relationships, including "x," may be used to determine the "m" and "n" initialization parameter index values, which, in turn, may be used to determine the respective slope and intersection values using the tables:

$m=x>>4$, $n=x\&15$ (or vice versa, $n=x>>4$ and $m=x\&15$).

Once again, in this example, ">>" indicates a right shift operation, and "&" indicates a logic AND operation.

In some examples, instead of storing SlopeTable and IntersectionTable, as described above, the values of the slope and intersection can be calculated using the following expressions:

Slope=$m*5-45$

Intersection=$n*8-16$ (or equivalently Intersection=$(n<<3)-16$)

In other examples, the 4-bits of the "m" parameter, and the 4-bits of the "n" parameter can be combined into an 8-bit parameter "idx," where, instead of using two separate index values to determine the slope and intersection values, a single index value (i.e., "idx") may be used, as shown in the following expressions:

Slope=SlopeTable[$idx$]

Intersection=IntersectionTable[$idx$]

As another example, this disclosure also describes techniques for determining one or more initial context states for initializing one or more contexts of a context adaptive entropy coding process used to code video data based on one or more initialization parameters and a temporal layer parameter associated with the video data, and initializing the one or more contexts of the context adaptive entropy coding process based on the one or more initial context states.

Figure 4:
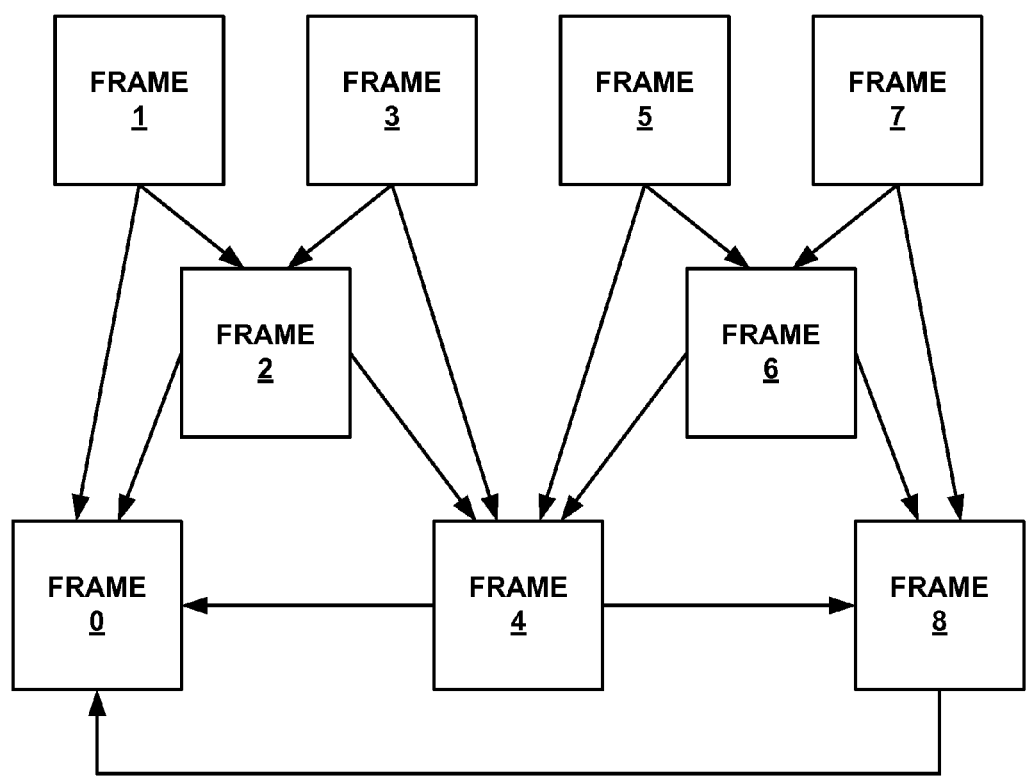
FIG. 4 is a conceptual diagram illustrating an example of a temporal hierarchy of a coded video sequence coded using scalable video coding, consistent with the techniques of this disclosure.

As one example, as illustrated in FIG. 4, and as described in greater detail below, a frame of video data can be encoded in a hierarchical structure. For example, as depicted in FIG. 4, frames "0," "4,"," and "8" are coded in temporal layer "0," frames "2" and "6" are coded in temporal layer "1," and the remaining frames (i.e., frames "1," "3," "5," and "7") are coded in temporal layer "2." Development of the techniques of this disclosure has demonstrated that the dependency among different frames of video data may be asymmetrical. For example, frames of video data located in lower temporal layers may be reference frames of frames of video data located in higher temporal layers (e.g., as shown by the arrows depicted in FIG. 4). As also shown in FIG. 4, such dependencies in directions that are reversed relative to those illustrated in FIG. 4 may not be allowed. As a result, initial probabilities of contexts of a context adaptive entropy coding process used to code one or more frames of video data may vary depending on a temporal layer associated with the frames of video data.

Accordingly, this disclosure describes techniques for adding an offset to an initial context state derived using the linear relationship described above with reference to H.264/AVC and HEVC, e.g., using the following relationships:

Int $i$InitState=$((m*iQp)/16)+n$+offset;

$i$InitState=min(max(1,$i$InitState),126).

In one example, a value of "offset" may be fixed and dependent on a temporal layer of a current slice associated with the data being coded (e.g., a frame of video data). For example, the value of "offset" may be set to "−2" for temporal layer "0," set to "2" for temporal layer "1," set to "3" for temporal layer "2," and set to "4" for temporal layer "3." In another example, "offset" may be a function of the temporal layer, e.g., as shown in the following expression:

offset=offset_base*(temporal_layer−$c0$)+$c1$ where "offset_base" corresponds to a base offset value, "temporal_layer" corresponds to the temporal layer associated with the coded data, "c0" and "c1" correspond to constants, and "offset" corresponds to the resultant offset used in the linear context initialization relationship described above.

In another example, the offset may be used in the manner shown in the following relationships:

Int $i$InitState=$(((m*iQp)/16)+n)*(1+$offset$)$;

$i$InitState=min(max(1,$i$InitState),126).

In some cases, the value of "offset" can also be derived from other "side" information associated with the coded data, such as, e.g., slice type, frame resolution, reference frame list size, etc.

In yet another example, the value of "offset" may be signaled in high level syntax, such as, e.g., a picture parameter set (PPS), a sequence parameter set (SPS), an adaptation parameter set (APS), or other syntax information, associated with the data, e.g., another parameter set or high level syntax location.

In the above examples, there can be a single value of "offset" for all of the contexts, or there can be multiple values of "offset," wherein each value is applied to a particular subset of the contexts. In one example, the contexts may be divided into three groups (i.e., G1, G2 and G3) and use a single value of "offset," such as shown in the expressions below:

For $G1$,

Int $i$InitState=$((m*iQp)/16)+n$+offset;

$i$InitState=min(max(1,$i$InitState),126).

For $G2$,

Int $i$InitState=$((m*iQp)/16)+n$−offset;

$i$InitState=min(max(1,$i$InitState),126).

For $G3$,

Int $i$InitState=$((m*iQp)/16)+n$;

$i$InitState=min(max(1,$i$InitState),126).

As another example, an adjustment of the initial context state can also be achieved by adjusting a QP, e.g., iQP, in the linear relationship described above with reference to H.264/AVC and HEVC. For example, a new parameter "iQp_new" may be used to calculate the initial context state, wherein "iQp_new" can be different from the QP used to encode video data of a particular frame (e.g., the frame for which the initial context state is determined), as shown in the following relationships:

Int $i$InitState=$((m*iQp\_new)/16)+n$;

$i$InitState=min(max(1,$i$InitState),126).

In another example, a new parameter "QP_offset" may be used to modify a QP, e.g., iQP, in the linear relationship described above with reference to H.264/AVC and HEVC, as shown in the following relationships:

Int $i$InitState=$((m*(QP+Qp\_offset)/16)+n$;

$i$InitState=min(max(1,$i$InitState),126), or, alternatively:

Int $i$InitState=$((m*QP*(1+Qp\_offset)/16)+n$;

$i$InitState=min(max(1,$i$InitState),126).

In yet another example, the value of "iQp_new" or "Qp_offset" may be signaled in high level syntax, such as, e.g., PPS, SPS, APS, or another parameter set or high level syntax location.

In the example described above, there can be a single value of "iQp_new" or "Qp_offset" for all of the contexts, or multiple values of "iQp_new" or "Qp_offset," wherein each value is applied to a particular subset of the contexts.

In one example, the value of "Qp_offset" and/or "iQp_new" may be fixed and dependent on the temporal layer of the current slice associated with the coded data. For example, "Qp_offset" can be set to "−3" for temporal layer "0," set to "0" for temporal layer "1," set to "3" for temporal layer "2," and set to "6" for temporal layer "3." In another example, "Qp_offset" can be a function of the temporal layer, e.g., as shown in the following relationship:

$Qp\_offset=Qp\_offset\_base*(temporal\_layer-c0)+c1$ where "Qp_offset_base," "c0," and "c1" are constants serving as parameters of the relationship. Similarly, the value of "Qp_offset" and/or "iQp_new" can also be derived from other "side" information, such as, e.g., slice type, frame resolution, reference frame list size, etc.

As yet another example, the techniques described above, including the techniques that relate to initializing one or more contexts of a context adaptive entropy coding process used to code data based on one or more initialization parameter index values, can be used for all of the contexts of the context adaptive entropy coding process, or for only some (e.g., a subset) of the contexts. For example, the techniques can be used for contexts related to certain syntax element types, e.g., syntax elements for selected color components (e.g., "luma" or "chroma" components), selected block sizes, selected transform sizes, motion information, or transform coefficient information.

As yet another example, this disclosure describes techniques for determining a first value, in the event the first value is within a range of values defined by a lower bound, an upper bound, and one or more offsets relative to one or more of the lower bound and the upper bound, selecting the first value, in the event the first value is outside of the range of values, selecting a second value, wherein the second value is different than the first value, and initializing a probability of a context of a context adaptive entropy coding process based on the selected first or second value.

As one example, in determining initial probabilities of contexts, the techniques described above with reference to versions of CABAC where a context state for a context directly corresponds to a probability of the context, highly skewed distributions of the initial probabilities of contexts may occur. For example, the highly skewed probabilities may result from the determined initial probabilities being proximate to one or more of an upper bound and a lower bound of a probability range that includes the initial probabilities. As a result, the techniques of this disclosure propose introducing one or more offsets that reduce, or prevent, such skewed probabilities. For example, the proposed techniques may be performed using the following relationship:

$iP0=\min(\max(1+\text{offset},c),32767-\text{offset})$ where "offset" is an integer value. As one example, a value of "offset" equal to "256" may allow for initial probabilities without highly skewed values.

As another example, the value of "offset" may be "matched" to a probability update process. In other words, in some examples, the same or a similar offset may be used for purposes of subsequently updating the initialized probabilities for the contexts. Accordingly, this update process may also result in avoiding "extreme" (e.g., close to 0% or 100%) probabilities of the contexts (i.e., highly skewed probabilities). As a result, both initializing and subsequently updating the probabilities (i.e., the probability initialization process and the probability update process described above) may impose the same limits on the extreme probabilities of the contexts, thereby possibly avoiding highly skewed probabilities of the contexts. As an example, the probability update process may be performed using the following relationships:

$$iP0 -= ((iP0-\text{offset}) \gg \text{ALPHA0});$$

$$iP0 += (((32767-\text{offset})-iP0) \gg \text{ALPHA0}),$$

where ALPHA0 is a constant.

In these examples, the functions, or relationships shown above may be referred to as "memory decay exponential" functions. For example, an asymptotic value of a particular exponential function (i.e., a lowest or highest possible value) is governed by the value of "offset." For example, the value of "offset" can be the same for both the initialization and the update processes described above.

As another example, the previously described relationship $$\text{Int } c = \text{asCtxInit}[0] + \text{asCtxInit}[1] * (iQp - iQ\text{Preper})$$

may provide the probability of a value of a symbol (e.g., a bin) being "0," without providing the probability of the value of the symbol being "1."

The following initialization function, or relationship, may be used to obtain the probability of the value of the symbol being "1," as one example:

$$iP0 = 32768 - \min(\max(1+\text{offset}, c), 32767-\text{offset})$$

where the meaning of the probability is reversed. In other words, the relationship above provides a value of "1" (i.e., a probability of "1," or 100%) minus the probability derived using the previously described relationship:

$$iP0 = \min(\max(1+\text{offset}, c), 32767-\text{offset})$$

Furthermore, in this example, "32768" may be a maximum probability, which may be equivalent to a probability of "1" (i.e., a probability of 100%).

Additionally, this disclosure also describes techniques for determining an initial context state for initializing a context of a context adaptive entropy coding process used to code video data based on an initialization parameter that defines three or more reference context states each corresponding to a respective one of three or more reference QP values, and a QP value associated with the video data, and initializing the context of the context adaptive entropy coding process based on the initial context state.

For example, as explained above, in H.264/AVC and certain draft versions of HEVC, an initial context state for a context is determined based on a linear derivation method, or relationship. The method uses two initialization parameters (i.e., "m" and "n"), each of which is represented using at least 8 bits of data. The linear relationship, or equation, uses these two initialization parameters to derive one of, e.g., 126 context states allowed in H.264/AVC, as the initial context state for the context.

Development of the techniques of this disclosure has demonstrated that nonlinear models, or relationships, can be more effective than linear relationships, such as the linear relationship described above with reference to H.264/AVC and HEVC, for initializing contexts. In particular, the nonlinear relationships may result in relatively more accurate initial probabilities of the contexts, compared to initial probabilities determined using the linear relationships. Accordingly, this disclosure proposes the use of a nonlinear, or a partially non-linear method, or relationship, to determine an initial context state for a context, e.g., using a limited number of bits of data. In some examples, the techniques propose using a same number of bits of data, or fewer bits of data, compared to the number of bits of data used in the H.264/AVC and HEVC techniques described above, i.e., 16 bits of data or fewer.

As one example, 16 bits of data may be used to determine an initial context state for a context. The usage of the 16 bits may be divided into three parts. A first part may include 6 bits, providing the context state at a given QP value (e.g., QP="26"). It should be noted that this context state value is quantized, such that 2 contiguous context states share the same quantized context state (e.g., since a bit-depth of 6 bits provides 64 indices that have to signal one of the 126 context states). A second part may include 5 bits, providing the context state at a second QP value (e.g., the previous QP minus "8"). Once again, this may be a quantized context state, since a bit-depth of 5 bits provides 32 indices that have to signal one of the 126 context states. In this example, 4 context states share the same quantized context state. Finally, a third part of the 16 bits may include the 5 remaining bits that indicate the context state at a third QP value (e.g., the first QP plus "8").

As a result, the initialization parameter of this example may include 16 bits of data, e.g., InitParam=[$x_1$ $x_2$ $x_3$]. In this example, "$x_3$" may be obtained using an operation "$x_3$=(InitParam&31)." Similarly, "$x_2$" may be obtained using operation "$x_2$=((InitParam$\gg$5) &31)," and "$x_1$" may be obtained using operation "$x_1$=(InitParam$\gg$10)." In this manner, the parameter "InitParam" contains the parameters required for the initial context state derivation. Once again, in this example, "$\gg$" indicates a right shift operation, and "&" indicates a logic AND operation.

These three values (i.e., "$x_1$," "$x_2$," and "$x_3$"), using a total of 16 bits of data, of quantized context states provide three points (e.g., value "pairs," each pair including one of "$x_1$," "$x_2$," and "$x_3$" and a corresponding QP value) which can be used for interpolation of the context state for the context to the rest of the QP values. In other words, the reference context state values "$x_1$," "$x_2$," and "$x_3$," and the corresponding reference QP values, can be used to determine an initial context state for a context by interpolating among the reference values, and using an actual QP associated with the data being coded to determine the initial context state for the context.

As one example, the above-described determination may be performed using a double linear approximation (e.g., splines). For example, the following relationships may be used:

```
if QP < 26
    iInitState = (QP − 26)*(x₁ − x₂)/8 + x₁;
else
    iInitState = (QP − 26)*(x₃ − x₁)/8 + x₁;
end
```

In this example, "$x_1$," "$x_2$," and "$x_3$" contain the values of the context state at the three different QPs (i.e., "26," "18," and "34," respectively). Furthermore, if variables "x" (i.e., "$x_1$," "$x_2$," and "$x_3$") do not contain the values in the correct bit-depths, as explained above, performing some bit left-shift operations may be necessary.

Additionally, a division by "8" may be performed as a bit right-shift operation. In such instances, the techniques of this example may be implemented using the following expressions:

```
if QP < 26
    iInitState = (QP − 26)*((x₁<<1) − (x₂<<2))>>3 + (x₁<<1);
else
    iInitState = (QP − 26)*((x₃<<2) − (x₁<<1))>>3 + (x₁<<1);
end
```

The expressions above may be premised on "$x_1$" having a precision of 6 bits, and "$x_2$" and "$x_3$" each having a precision of 5 bits. In some examples, an addition of "4" may also be included before the right-shift operation in the expressions for purposes of rounding to a closest integer when dividing by "8" (e.g., instead of simply rounding to the lower integer). Accordingly, slight modifications to these expressions may be used if the values are defined to support other bit depths.

Using the techniques described above, the double-linear interpolation for determining the initial context state can be performed without multiplications or divisions. This straightforward implementation is possible because the difference between the QP values employed is a power of "2."

In other examples, other QP values may also be used. Additionally, other bit-depth distribution for each of the three values of quantized context states could also be used. Additionally, more than 3 points (e.g., 4 or more points) could be used, being then the function multi-linear (i.e., several linear parts put together).

In still other examples, the three points may be used to fit a parabola (e.g., a second order polynomial) to determine the context state at the other QPs. Similarly, in other examples, four points may be used to fit a third order polynomial.

Additionally, a clipping operation, e.g., performed using the expression shown below, may also be included following the non-linear context state derivation process described above, in order to avoid disallowed context state values (e.g., context state values that require more than 7 bits of data to represent each value).

$$iInitState = \min(\max(1, iInitState), 126)$$

Accordingly, in some examples consistent with the techniques of this disclosure, video encoder 20 of source device 12 may be configured to encode data, such as one or more blocks of video data (e.g., one or more TUs of a CU), and video decoder 30 of destination device 14 may be configured to receive the encoded data, e.g., the encoded one or more blocks of video data, from video encoder 20. In other examples, as described above, the techniques of this disclosure may be applicable to using context adaptive entropy coding to code any of a wide variety of data, e.g., other than video data. As such, in some examples consistent with the disclosed techniques, video encoder 20 and/or video decoder 30 may be other encoding and decoding devices, other than video encoding and decoding devices, as illustrated in this example.

As one example, video encoder 20 and/or video decoder 30 may be configured for context adaptive entropy coding. In this example, one or more of video encoder 20 and video decoder 30 may include a coder (e.g., entropy encoding unit 56 or entropy decoding unit 80), configured to determine one or more initialization parameters for a context adaptive entropy coding process (e.g., a CABAC, SBAC, PIPE, or another process) based on one or more initialization parameter index values. For example, as will be described in greater detail below, video encoder 20 and/or video decoder 30 may be configured to determine the one or more initial context states by mapping the one or more initialization parameter index values to the one or more initialization parameters in one or more tables (i.e., identify the one or more initialization parameters in the one or more tables based on the one or more initialization parameter index values), or by calculating the one or more initialization parameters using the one or more initialization parameter index values and one or more formulas.

Video encoder 20 and/or video decoder 30 may be further configured to determine one or more initial context states for initializing one or more contexts of the context adaptive entropy coding process based on the one or more initialization parameters. For example, video encoder 20 and/or video decoder 30 may be configured to determine the one or more initial context states using the one or more initialization parameters and a relationship, such as the linear relationship described above with reference to H.264/AVC and certain draft versions of HEVC. Additionally, video encoder 20 and/or video decoder 30 may be still further configured to initialize the one or more contexts of the context adaptive entropy coding process based on the one or more initial context states. For example, video encoder 20 and/or video decoder 30 may be configured to initialize each of the one or more contexts by assigning a corresponding one of the one or more initial context states as the present context state of the respective context.

Accordingly, the techniques of this disclosure may enable video encoder 20 and/or video decoder 30 to have relatively lower complexity when used to code data, such as, e.g., the video data described above, compared to other systems used to code similar data. In particular, the techniques may reduce an amount of information that is stored within and/or transmitted to or from video encoder 20 and/or video decoder 30. Additionally, as described in greater detail below with reference to FIGS. 6-8, the techniques of this disclosure may also enable video encoder 20 and/or video decoder 30 to code the data more efficiently relative to other techniques. In this manner, there may be a relative reduction in complexity for video encoder 20 and/or video decoder 30 used to code the data, and a relative bit savings for a coded bitstream that includes the coded data, when using the techniques of this disclosure.

Video encoder 20 and video decoder 30 each may be implemented as any of a wide variety of suitable encoder or decoder circuitry, as applicable, such as one or more microprocessors, digital signal processors (DSPs), application specific integrated circuits (ASICs), field programmable gate arrays (FPGAs), discrete logic circuitry, software, hardware, firmware, or any combinations thereof. Each of video encoder 20 and video decoder 30 may be included in one or more encoders or decoders, either of which may be integrated as part of a combined video encoder/decoder (e.g., a video "CODEC"). An apparatus including video encoder 20 and/or video decoder 30 may comprise an integrated circuit (IC), a microprocessor, and/or a wireless communication device, such as a cellular telephone.

Figure 2:
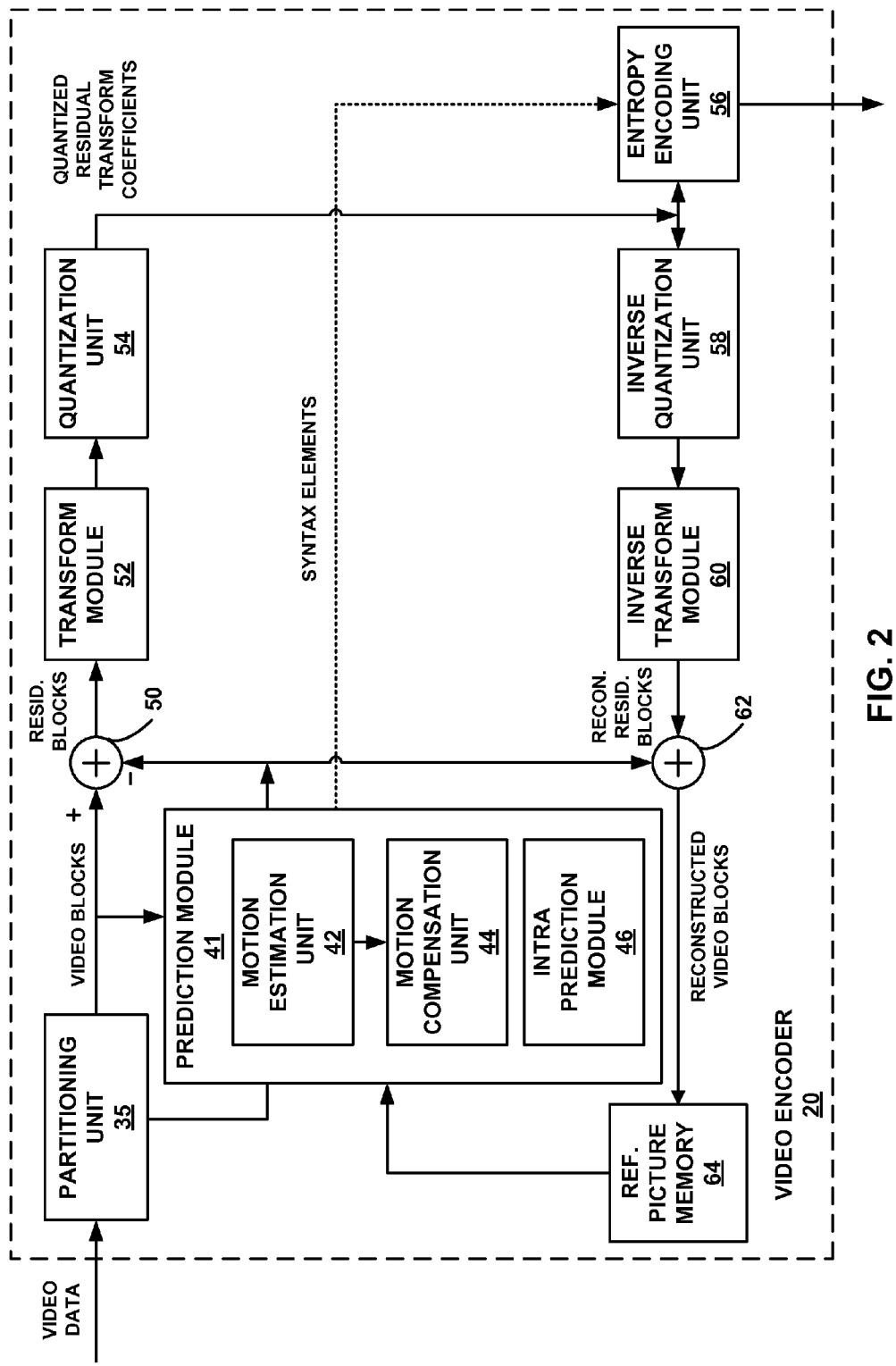
FIG. 2 is a block diagram illustrating an example of a video encoder that may implement techniques for context state and probability initialization for context adaptive entropy coding, consistent with the techniques of this disclosure.

FIG. 2 is a block diagram illustrating an example of a video encoder that may implement techniques for context state and probability initialization for context adaptive entropy coding, consistent with the techniques of this disclosure. Video encoder 20 may perform intra- and inter-coding of video blocks within video slices. Intra-coding relies on spatial prediction to reduce or remove spatial redundancy in video within a given video frame or picture. Inter-coding relies on temporal prediction to reduce or remove temporal redundancy in video within adjacent frames or pictures of a video sequence. Intra-mode (I mode) may refer to any of several spatial based compression modes. Inter-modes, such as uni-directional prediction (P mode) or bi-prediction (B mode), may refer to any of several temporal-based compression modes.

In the example of FIG. 2, video encoder 20 includes a partitioning unit 35, prediction module 41, reference picture memory 64, summer 50, transform module 52, quantization unit 54, and entropy encoding unit 56. Prediction module 41 includes motion estimation unit 42, motion compensation unit 44, and intra-prediction module 46. For video block reconstruction, video encoder 20 also includes inverse quantization unit 58, inverse transform module 60, and summer 62. A deblocking filter (not shown in FIG. 2) may also be included to filter block boundaries to remove blockiness artifacts from reconstructed video. If desired, the deblocking filter would typically filter the output of summer 62. Additional loop filters (in loop or post loop) may also be used in addition to the deblocking filter.

As shown in FIG. 2, video encoder 20 receives video data, and partitioning unit 35 partitions the data into video blocks. This partitioning may also include partitioning into slices, tiles, or other larger units, as wells as video block partitioning, e.g., according to a quadtree structure of LCUs and CUs. Video encoder 20 generally illustrates the components that encode video blocks within a video slice to be encoded. The slice may be divided into multiple video blocks (and possibly into sets of video blocks referred to as tiles). Prediction module 41 may select one of a plurality of possible coding modes, such as one of a plurality of intra-coding modes or one of a plurality of inter-coding modes, for the current video block based on error results (e.g., coding rate and the level of distortion). Prediction module 41 may provide the resulting intra- or inter-coded block to summer 50 to generate residual block data and to summer 62 to reconstruct the encoded block for use as a reference picture.

Intra-prediction module 46 within prediction module 41 may perform intra-predictive coding of the current video block relative to one or more neighboring blocks in the same frame or slice as the current block to be coded to provide spatial compression. Motion estimation unit 42 and motion compensation unit 44 within prediction module 41 perform inter-predictive coding of the current video block relative to one or more predictive blocks in one or more reference pictures to provide temporal compression.

Motion estimation unit 42 may be configured to determine the inter-prediction mode for a video slice according to a predetermined pattern for a video sequence. The predetermined pattern may designate video slices in the sequence as P slices, B slices or GPB slices. Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference picture.

A predictive block is a block that is found to closely match the PU of the video block to be coded in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in reference picture memory 64. Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation, possibly performing interpolations to sub-pixel precision. Upon receiving the motion vector for the PU of the current video block, motion compensation unit 44 may locate the predictive block to which the motion vector points in one of the reference picture lists. Video encoder 20 forms a residual video block by subtracting pixel values of the predictive block from the pixel values of the current video block being coded, forming pixel difference values. The pixel difference values form residual data for the block, and may include both luma and chroma difference components. Summer 50 represents the component or components that perform this subtraction operation. Motion compensation unit 44 may also generate syntax elements associated with the video blocks and the video slice for use by video decoder 30 in decoding the video blocks of the video slice.

Intra-prediction module 46 may intra-predict a current block, as an alternative to the inter-prediction performed by motion estimation unit 42 and motion compensation unit 44, as described above. In particular, intra-prediction module 46 may determine an intra-prediction mode to use to encode a current block. In some examples, intra-prediction module 46 may encode a current block using various intra-prediction modes, e.g., during separate encoding passes, and intra-prediction module 46 (or mode select unit 40, in some examples) may select an appropriate intra-prediction mode to use from the tested modes. For example, intra-prediction module 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bit rate (that is, a number of bits) used to produce the encoded block. Intra-prediction module 46 may calculate ratios from the distortions and rates for the various encoded blocks to determine which intra-prediction mode exhibits the best rate-distortion value for the block.

In any case, after selecting an intra-prediction mode for a block, intra-prediction module 46 may provide information indicative of the selected intra-prediction mode for the block to entropy encoding unit 56. Entropy encoding unit 56 may encode the information indicating the selected intra-prediction mode in a transmitted bitstream.

After prediction module 41 generates the predictive block for the current video block via either inter-prediction or intra-prediction, video encoder 20 forms a residual video block by subtracting the predictive block from the current video block. The residual video data in the residual block may be included in one or more TUs and applied to transform module 52. Transform module 52 transforms the residual video data into residual transform coefficients using a transform, such as a discrete cosine transform (DCT) or a conceptually similar transform. Transform module 52 may convert the residual video data from a pixel domain to a transform domain, such as a frequency domain.

Transform module 52 may send the resulting transform coefficients to quantization unit 54. Quantization unit 54 quantizes the transform coefficients to further reduce bit rate. The quantization process may reduce the bit depth associated with some or all of the coefficients. The degree of quantization may be modified by adjusting a quantization parameter. In some examples, quantization unit 54 may then perform a scan of the matrix including the quantized transform coefficients. Alternatively, entropy encoding unit 56 may perform the scan.

Following quantization, entropy encoding unit 56 entropy encodes the quantized transform coefficients. For example, entropy encoding unit 56 may perform CAVLC, CABAC, SBAC, PIPE, or another entropy encoding methodology or technique. Following the entropy encoding by entropy encoding unit 56, the encoded bitstream may be transmitted to video decoder 30, or archived for later transmission or retrieval by video decoder 30. Entropy encoding unit 56 may also entropy encode the motion vectors and the other syntax elements for the current video slice being coded.

Inverse quantization unit 58 and inverse transform module 60 apply inverse quantization and inverse transformation, respectively, to reconstruct the residual block in the pixel domain for later use as a reference block of a reference picture. Motion compensation unit 44 may calculate a reference block by adding the residual block to a predictive block of one of the reference pictures within one of the reference picture lists. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reference block for storage in reference picture memory 64. The reference block may be used by motion estimation unit 42 and motion compensation unit 44 as a reference block to inter-predict a block in a subsequent video frame or picture.

As one example, an apparatus that includes entropy encoding unit 56 (e.g., video encoder 20 of source device 12 of FIG. 1) may be configured for context adaptive entropy coding. For example, the apparatus may be configured to perform any of the CABAC, SBAC, or PIPE processes described above, as well as any other context adaptive entropy coding processes. In this example, entropy encoding unit 56 may be configured to determine one or more initialization parameters (e.g., one or more "m" and "n" parameters described above with reference to FIGS. 1 and 2) for a context adaptive entropy coding process (e.g., a CABAC process) based on one or more initialization parameter index values (e.g., one or more "idx_m" and "idx_n" values also described above with reference to FIG. 1). Additionally, entropy encoding unit 56 may be further configured to determine one or more initial context states for initializing one or more contexts of the context adaptive entropy coding process based on the one or more initialization parameters. Entropy encoding unit 56 may be still further configured to initialize the one or more contexts of the context adaptive entropy coding process based on the one or more initial context states.

In some examples, the one or more initialization parameters may be included in one or more tables. In these examples, to determine the one or more initialization parameters based on the one or more initialization parameter index values, entropy encoding unit 56 may be configured to map the one or more initialization parameter index values to the one or more initialization parameters in the one or more tables. In other words, to determine the one or more initialization parameters based on the one or more initialization parameter index values, entropy encoding unit 56 may be configured to identify the one or more initialization parameters in the one or more tables based on the one or more initialization parameter index values.

Alternatively, in other examples, to determine the one or more initialization parameters based on the one or more initialization parameter index values, entropy encoding unit 56 may be configured to calculate the one or more initialization parameters using the one or more initialization parameter index values and one or more formulas. In these examples, each of the one or more formulas may be implemented using only one or more operations each selected from a group consisting of a bit shift operation, an add operation, a subtract operation, a multiply operation, and a divide operation.

In still other examples, the one or more initialization parameters may include one or more slope values and one or more intersection values, and the one or more initialization parameter index values may include one or more slope index values and one or more intersection index values. In these examples, to determine the one or more initialization parameters based on the one or more initialization parameter index values, entropy encoding unit 56 may be configured to determine the one or more slope values based on the one or more slope index values, and determine the one or more intersection values based on the one or more intersection index values.

Alternatively, in some examples, the one or more initialization parameters may include one or more slope values and one or more intersection values. In these examples, to determine the one or more initialization parameters based on the one or more initialization parameter index values, entropy encoding unit 56 may be configured to determine at least one of the one or more slope values and at least one of the one or more intersection values based on a single one of the one or more initialization parameter index values.

In the above-described examples, the single one of the one or more initialization parameter index values may include one or more slope index value components and one or more intersection index value components. In these examples, to determine the at least one of the one or more slope values and the at least one of the one or more intersection values based on the single one of the one or more initialization parameter index values, entropy encoding unit 56 may be configured to determine the at least one of the one or more slope values based on the one or more slope index value components, and determine the at least one of the one or more intersection values based on the one or more intersection index value components.

Furthermore, in these examples, to determine the at least one of the one or more slope values based on the one or more slope index value components, and to determine the at least one of the one or more intersection values based on the one or more intersection index value components, entropy encoding unit 56 may be configured to determine one of the one or more slope index value components and the one or more intersection index value components of the single one of the one or more initialization parameter index values using one or more bit shift operations, and determine another one of the one or more slope index value components and the one or more intersection index value components of the single one of the one or more initialization parameter index values using one or more logical AND operations.

In still other examples, the single one of the one or more initialization parameter index values may include a predetermined number of bits. In these examples, each of the one or more slope index value components and the one or more intersection index value components may include a respective subset of the predetermined number of bits. Also in these examples, each of the subsets that correspond to the one or more slope index value components may include a different number of the predetermined number of bits than each of the subsets that correspond to the one or more intersection index value components.

Additionally, in some examples, the one or more contexts of the context adaptive entropy coding process may include a subset of contexts of the context adaptive entropy coding process. For example, the subset may correspond to a syntax type associated with video data coded using the context adaptive entropy coding process. In some examples, the syntax type may include one or more of a component type, a block size, a transform size, a prediction mode, motion information, and transform coefficient information, associated with the video data.

In other examples, the apparatus (e.g., video encoder 20 of source device 12 of FIG. 1) that includes entropy encoding unit 56 may be configured as a video encoder. In these examples, the video encoder may be configured to encode one or more syntax elements associated with a block of video data based on the initialized one or more contexts of the context adaptive entropy coding process, and output the encoded one or more syntax elements in a bitstream. In some examples, as previously described, the apparatus (e.g., video encoder 20 of source device 12 of FIG. 1) that includes entropy encoding unit 56 may include at least one of an integrated circuit, a microprocessor, and a wireless communication device that includes entropy encoding unit 56.

As described in greater detail below with reference to FIGS. 5-8, in other examples, video encoder 20, or various components thereof (e.g., entropy encoding unit 56) may be configured to perform other techniques that relate to context state and probability initialization for context adaptive entropy coding. For example, the techniques described below with reference to FIG. 5, which are similar to the techniques of this example, and the additional techniques described below with reference to FIGS. 6-8, may be performed by video encoder 20, or any components thereof, individually, or in any combination. As one example, one or more of the additional techniques may be performed in combination with the techniques of this example (and the example of FIG. 5) that relate to initializing contexts of a context adaptive entropy coding process used to code data based on one or more initialization parameter index values. In particular, the techniques described below with reference to FIGS. 6-8 relate to initializing one or more contexts of a context adaptive entropy coding process, including determining initial context states for the contexts that indicate initial probabilities of the contexts, or directly determining the initial probabilities of the contexts, such that the initial probabilities are more accurate relative to initial probabilities determined using other techniques.

Accordingly, as illustrated by the examples above, and as will be shown by the examples of FIGS. 5-8, the techniques of this disclosure may enable video encoder 20, or any components thereof, to encode various types of data, such as, e.g., the video data described above, more efficiently than when using other methods. As one example, as illustrated by the examples above (and as will be shown by the example of FIG. 5), the techniques may enable video encoder 20 to have lower complexity relative to other systems when encoding the data using the context adaptive entropy coding process. For example, the techniques may reduce an amount of information (e.g., a number of bits of data) stored within video encoder 20 and/or transmitted from video encoder 20 to a video decoder (e.g., video decoder 30) for purposes of initializing one or more contexts of the context adaptive entropy coding process. In particular, the amount of stored information may be reduced by storing and/or transmitting initialization parameter index values that indicate initialization parameters used to initialize the contexts, rather than storing and/or transmitting the initialization parameters directly.

In some examples, the amount of stored information may be reduced by defining the initialization parameter index values such that the initialization parameter index values are represented using less information (e.g., fewer bits of data) than the initialization parameters. As a result, the initialization parameter index values may correspond to only a subset of the initialization parameters. In this manner, fewer than all of the initialization parameters, as indicated by the initialization parameter index values, may be used to initialize the contexts. For example, some of the contexts may be initialized using common initialization parameters. Nevertheless, any adverse effects associated with using the subset of initialization parameters, rather than all of the initialization parameters (e.g., the initial probabilities of the contexts being relatively less accurate compared to initial probabilities determined using all of the initialization parameters, wherein each context is initialized using a unique one or more initialization parameters), may be outweighed by the reduced amount of information stored within video encoder 20, and, in some cases, transmitted from video encoder 20 to the video decoder, as described above.

In this manner, in some examples, the initialization parameter index values indicating the subset of initialization parameters, and the subset of initialization parameters itself, may be stored within video encoder 20, thereby possibly reducing the amount of information stored within video encoder 20. For example, in some cases, because the initialization parameter index values may be represented using less information than the initialization parameters, and because the initialization parameter index values may correspond to only a subset of the initialization parameters, a total amount of information (e.g., a total number of bits of data) used to store the initialization parameter index values and the subset of initialization parameters within video encoder 20 may be reduced relative to an amount of information that would be required to store all of the initialization parameters within video encoder 20. Furthermore, in other cases, the initialization parameter index values, rather than the initialization parameters, may be transmitted from video encoder 20 to the video decoder, thereby reducing a total amount of information transmitted from video encoder 20 to the video decoder.

Figure 6:
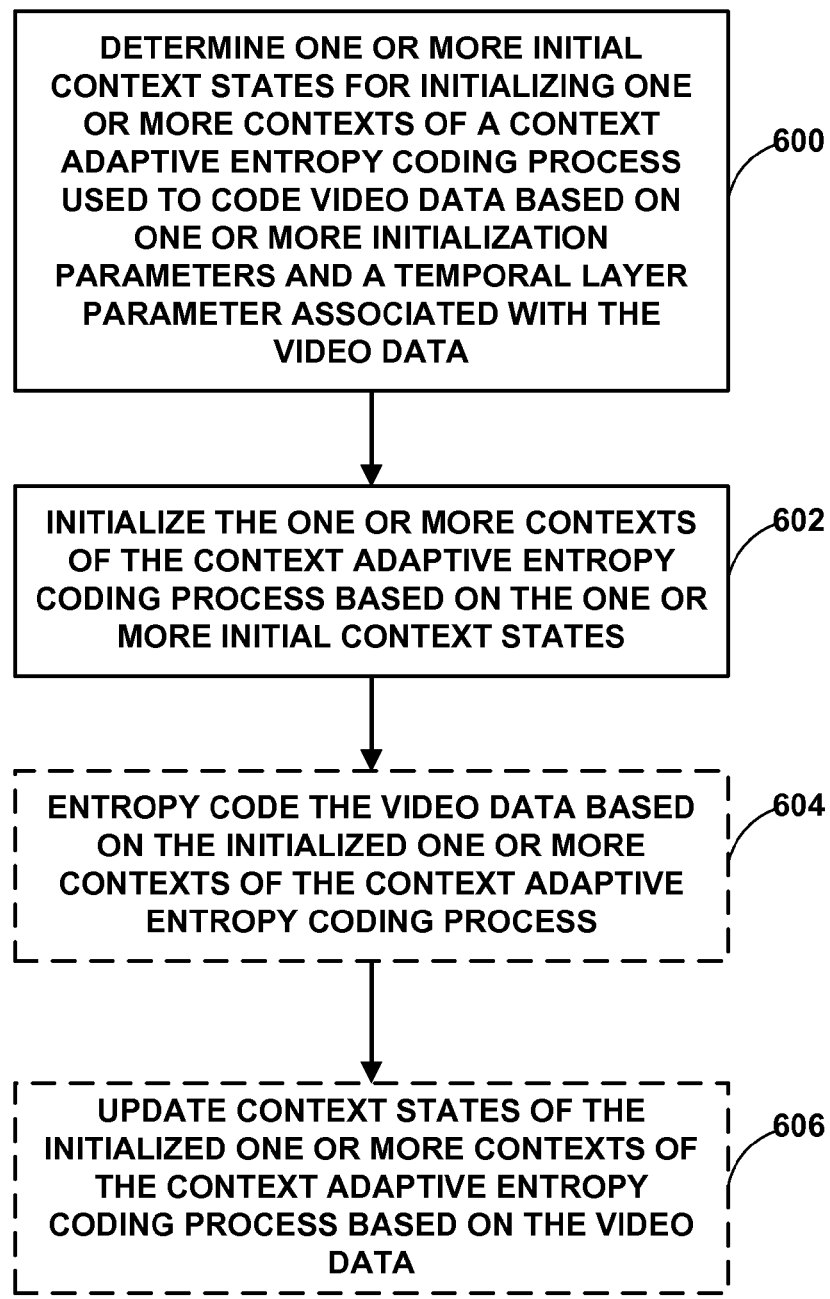
Figure 7:
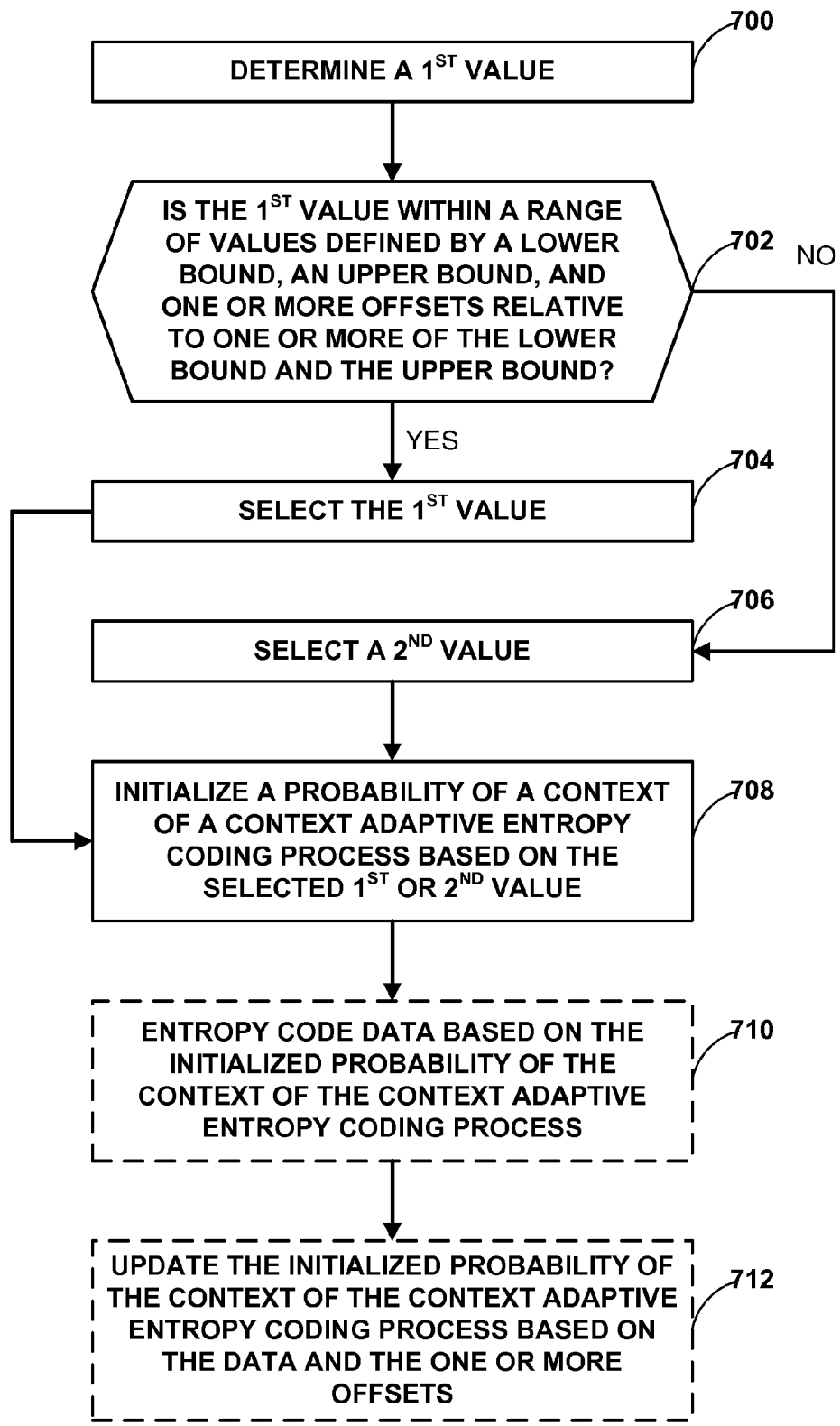
Figure 8:
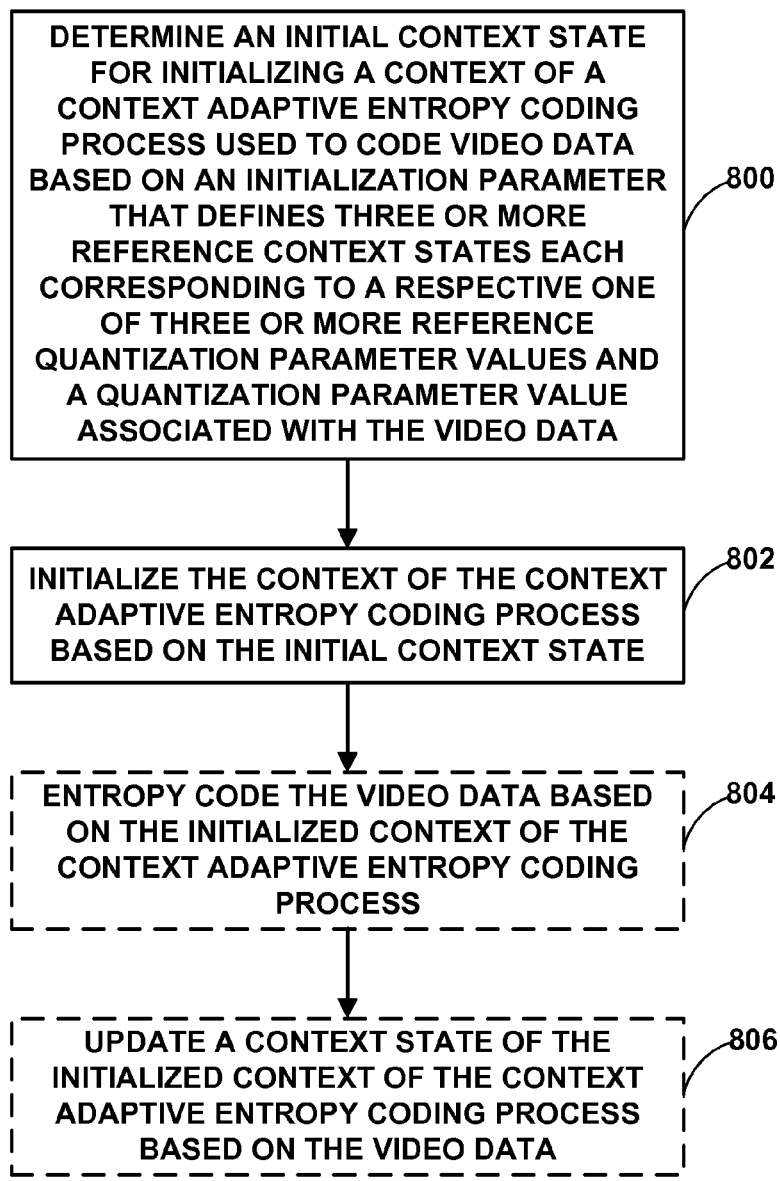

As another example, as will be shown by the examples of FIGS. 6-8, the techniques of this disclosure may improve compression of the data when video encoder 20 is configured to encode the data using a context adaptive entropy coding process. For example, the techniques may improve the compression of the data by enabling video encoder 20, or any components thereof, to initialize one or more contexts of the context adaptive entropy coding process, such that the one or more contexts include relatively more accurate initial probabilities compared to initial probabilities determined using other context initialization techniques. Additionally, in some examples, the techniques may further improve the compression of the data by enabling video encoder 20, or any components thereof, to subsequently update the probabilities of the contexts such that the updated probabilities are more accurate compared to probabilities updated using other context probability update techniques.

Accordingly, there may be a relative bit savings for a coded bitstream that includes the encoded data, and, in some cases, the initialization parameter index values transmitted from video encoder 20 to the video decoder (e.g., video decoder 30), and a relative reduction in complexity of video encoder 20 used to encode the data, when using the techniques of this disclosure.

In this manner, video encoder 20 represents an example of an apparatus for context adaptive entropy coding, the apparatus comprising a coder configured to determine one or more initialization parameters for a context adaptive entropy coding process based on one or more initialization parameter index values, determine one or more initial context states for initializing one or more contexts of the context adaptive entropy coding process based on the one or more initialization parameters, and initialize the one or more contexts of the context adaptive entropy coding process based on the one or more initial context states.

Figure 3:
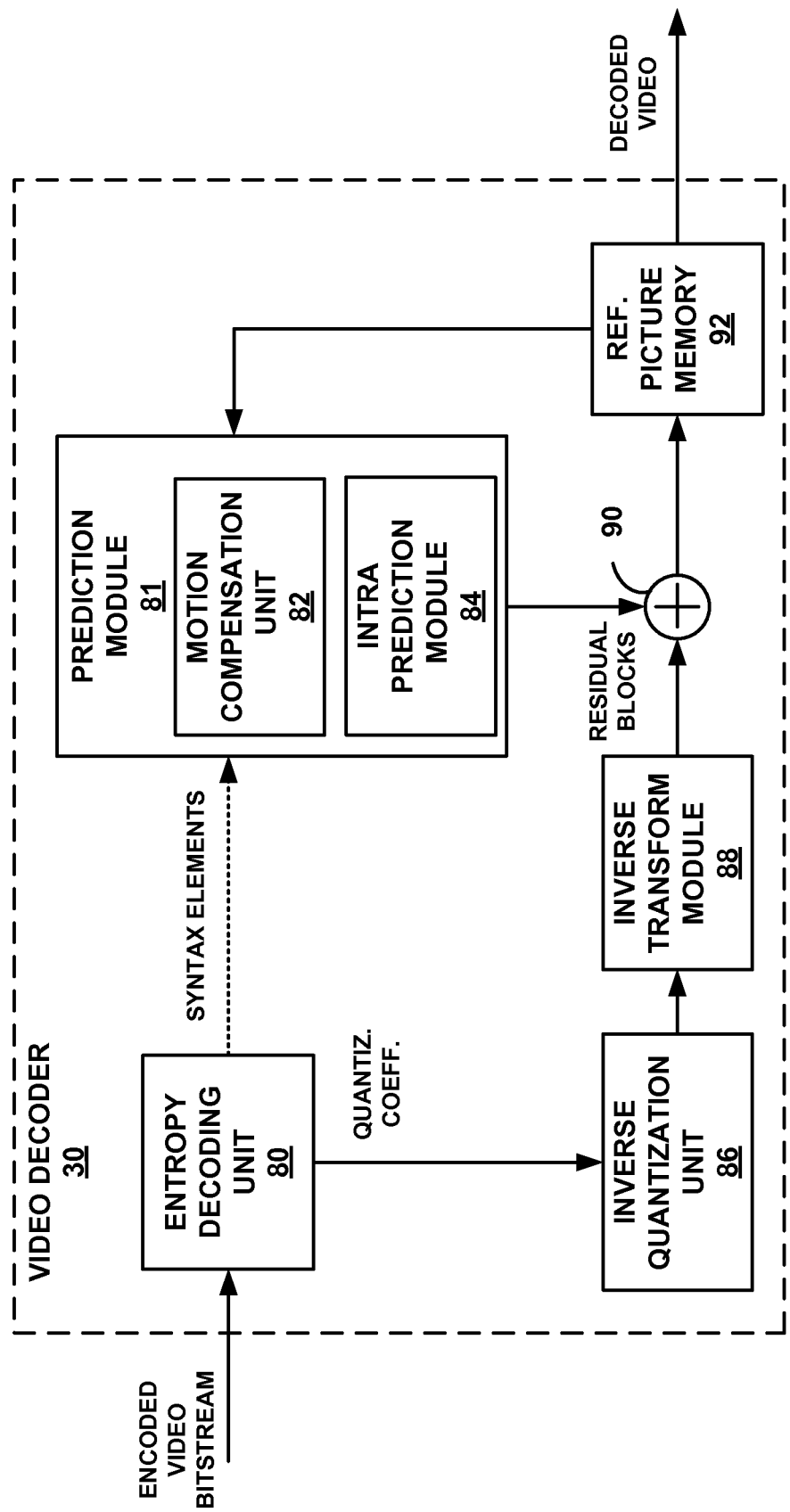
FIG. 3 is a block diagram illustrating an example of a video decoder that may implement techniques for context state and probability initialization for context adaptive entropy coding, consistent with the techniques of this disclosure.

FIG. 3 is a block diagram illustrating an example of a video decoder that may implement techniques for context state and probability initialization for context adaptive entropy coding, consistent with the techniques of this disclosure. In the example of FIG. 3, video decoder 30 includes an entropy decoding unit 80, prediction module 81, inverse quantization unit 86, inverse transform module 88, summer 90, and reference picture memory 92. Prediction module 81 includes motion compensation unit 82 and intra-prediction module 84. Video decoder 30 may, in some examples, perform a decoding pass generally reciprocal to the encoding pass described with respect to video encoder 20 from FIG. 2.

During the decoding process, video decoder 30 receives an encoded video bitstream that represents video blocks of an encoded video slice and associated syntax elements from video encoder 20. Entropy decoding unit 80 of video decoder 30 entropy decodes the bitstream to generate quantized coefficients, motion vectors, and other syntax elements. Entropy decoding unit 80 forwards the motion vectors and other syntax elements to prediction module 81. Video decoder 30 may receive the syntax elements at the video slice level and/or the video block level.

When the video slice is coded as an intra-coded (I) slice, intra-prediction module 84 of prediction module 81 may generate prediction data for a video block of the current video slice based on a signaled intra-prediction mode and data from previously decoded blocks of the current frame or picture. When the video frame is coded as an inter-coded (i.e., B, P or GPB) slice, motion compensation unit 82 of prediction module 81 produces predictive blocks for a video block of the current video slice based on the motion vectors and other syntax elements received from entropy decoding unit 80. The predictive blocks may be produced from one of the reference pictures within one of the reference picture lists. Video decoder 30 may construct the reference frame lists, List 0 and List 1, using default construction techniques based on reference pictures stored in reference picture memory 92.

Motion compensation unit 82 determines prediction information for a video block of the current video slice by parsing the motion vectors and other syntax elements, and uses the prediction information to produce the predictive blocks for the current video block being decoded. For example, motion compensation unit 82 uses some of the received syntax elements to determine a prediction mode (e.g., intra- or inter-prediction) used to code the video blocks of the video slice, an inter-prediction slice type (e.g., B slice, P slice, or GPB slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 82 may also perform interpolation based on interpolation filters. Motion compensation unit 82 may use interpolation filters as used by video encoder 20 during encoding of the video blocks to calculate interpolated values for sub-integer pixels of reference blocks. In this case, motion compensation unit 82 may determine the interpolation filters used by video encoder 20 from the received syntax elements and use the interpolation filters to produce predictive blocks.

Inverse quantization unit 86 inverse quantizes, i.e., de-quantizes, the quantized transform coefficients provided in the bitstream and decoded by entropy decoding unit 80. The inverse quantization process may include use of a quantization parameter calculated by video encoder 20 for each video block in the video slice to determine a degree of quantization and, likewise, a degree of inverse quantization that should be applied. Inverse transform module 88 applies an inverse transform, e.g., an inverse DCT, an inverse integer transform, or a conceptually similar inverse transform process, to the transform coefficients in order to produce residual blocks in the pixel domain.

After motion compensation unit 82 generates the predictive block for the current video block based on the motion vectors and other syntax elements, video decoder 30 forms a decoded video block by summing the residual blocks from inverse transform module 88 with the corresponding predictive blocks generated by motion compensation unit 82. Summer 90 represents the component or components that perform this summation operation. If desired, a deblocking filter may also be applied to filter the decoded blocks in order to remove blockiness artifacts. Other loop filters (either in the coding loop or after the coding loop) may also be used to smooth pixel transitions, or otherwise improve the video quality. The decoded video blocks in a given frame or picture are then stored in reference picture memory 92, which stores reference pictures used for subsequent motion compensation. Reference picture memory 92 also stores decoded video for later presentation on a display device, such as display device 28 of FIG. 1.

As one example, an apparatus that includes entropy decoding unit 80 (e.g., video decoder 30 of destination device 14 of FIG. 1) may be configured for context adaptive entropy coding. For example, the apparatus may be configured to perform any of the CABAC, SBAC, or PIPE processes described above. In this example, entropy decoding unit 80 may be configured to determine one or more initialization parameters (e.g., one or more "m" and "n" parameters described above with reference to FIGS. 1 and 2) for a context adaptive entropy coding process (e.g., a CABAC process) based on one or more initialization parameter index values (e.g., one or more "idx_m" and "idx_n" values also described above with reference to FIG. 1). Additionally, entropy decoding unit 80 may be further configured to determine one or more initial context states for initializing one or more contexts of the context adaptive entropy coding process based on the one or more initialization parameters. Entropy decoding unit 80 may be still further configured to initialize the one or more contexts of the context adaptive entropy coding process based on the one or more initial context states.

In some examples, the one or more initialization parameters may be included in one or more tables. In these examples, to determine the one or more initialization parameters based on the one or more initialization parameter index values, entropy decoding unit 80 may be configured to map the one or more initialization parameter index values to the one or more initialization parameters in the one or more tables. In other words, to determine the one or more initialization parameters based on the one or more initialization parameter index values, entropy decoding unit 80 may be configured to identify the one or more initialization parameters in the one or more tables based on the one or more initialization parameter index values.

Alternatively, in other examples, to determine the one or more initialization parameters based on the one or more initialization parameter index values, entropy decoding unit 80 may be configured to calculate the one or more initialization parameters using the one or more initialization parameter index values and one or more formulas. In these examples, each of the one or more formulas may be implemented using only one or more operations each selected from a group consisting of a bit shift operation, an add operation, a subtract operation, a multiply operation, and a divide operation.

In still other examples, the one or more initialization parameters may include one or more slope values and one or more intersection values, and the one or more initialization parameter index values may include one or more slope index values and one or more intersection index values. In these examples, to determine the one or more initialization parameters based on the one or more initialization parameter index values, entropy decoding unit 80 may be configured to determine the one or more slope values based on the one or more slope index values, and determine the one or more intersection values based on the one or more intersection index values.

Alternatively, in some examples, the one or more initialization parameters may include one or more slope values and one or more intersection values. In these examples, to determine the one or more initialization parameters based on the one or more initialization parameter index values, entropy decoding unit 80 may be configured to determine at least one of the one or more slope values and at least one of the one or more intersection values based on a single one of the one or more initialization parameter index values.

In the above-described examples, the single one of the one or more initialization parameter index values may include one or more slope index value components and one or more intersection index value components. In these examples, to determine the at least one of the one or more slope values and the at least one of the one or more intersection values based on the single one of the one or more initialization parameter index values, entropy decoding unit 80 may be configured to determine the at least one of the one or more slope values based on the one or more slope index value components, and determine the at least one of the one or more intersection values based on the one or more intersection index value components.

Furthermore, in these examples, to determine the at least one of the one or more slope values based on the one or more slope index value components, and to determine the at least one of the one or more intersection values based on the one or more intersection index value components, entropy decoding unit 80 may be configured to determine one of the one or more slope index value components and the one or more intersection index value components of the single one of the one or more initialization parameter index values using one or more bit shift operations, and determine another one of the one or more slope index value components and the one or more intersection index value components of the single one of the one or more initialization parameter index values using one or more logical AND operations.

In still other examples, the single one of the one or more initialization parameter index values may include a predetermined number of bits. In these examples, each of the one or more slope index value components and the one or more intersection index value components may include a respective subset of the predetermined number of bits. Also in these examples, each of the subsets that correspond to the one or more slope index value components may include a different number of the predetermined number of bits than each of the subsets that correspond to the one or more intersection index value components.

Additionally, in some examples, the one or more contexts of the context adaptive entropy coding process may include a subset of contexts of the context adaptive entropy coding process. For example, the subset may correspond to a syntax type associated with video data coded using the context adaptive entropy coding process. In some examples, the syntax type may include one or more of a component type, a block size, a transform size, a prediction mode, motion information, and transform coefficient information, associated with the video data.

In other examples, the apparatus (e.g., video decoder 30 of destination device 14 of FIG. 1) that includes entropy decoding unit 80 may be configured as a video decoder. In these examples, the video decoder may be configured to receive one or more encoded syntax elements associated with a block of video data in a bitstream, and decode the one or more encoded syntax elements based on the initialized one or more contexts of the context adaptive entropy coding process.

In some examples, as previously described, the apparatus (e.g., video decoder 30 of destination device 14 of FIG. 1) that includes entropy decoding unit 80 may include at least one of an integrated circuit, a microprocessor, and a wireless communication device that includes entropy decoding unit 80.

In a similar manner as described above with reference to FIG. 3, and as described below with reference to FIGS. 5-8, in other examples, video decoder 30, or various components thereof (e.g., entropy decoding unit 80) may be configured to perform other techniques that relate to context state and probability initialization for context adaptive entropy coding. For example, the techniques described below with reference to FIG. 5, which are similar to the techniques of this example, and the additional techniques described below with reference to FIGS. 6-8, may be performed by video decoder 30, or any components thereof, individually, or in any combination. As one example, one or more of the additional techniques may be performed in combination with the techniques of this example (and the example of FIG. 5) that relate to initializing contexts of a context adaptive entropy coding process used to code data based on one or more initialization parameter index values. In particular, the techniques described below with reference to FIGS. 6-8 relate to initializing one or more contexts of a context adaptive entropy coding process, including determining initial context states for the contexts that indicate initial probabilities of the contexts, or directly determining the initial probabilities of the contexts, such that the initial probabilities are more accurate relative to initial probabilities determined using other techniques.

Accordingly, as illustrated by the examples above, and as will be shown by the examples of FIGS. 5-8, the techniques of this disclosure may enable video decoder 30, or any components thereof, to decode various types of encoded data, such as, e.g., the encoded video data described above, more efficiently than when using other methods. As one example, as illustrated by the examples above (and as will be shown by the example of FIG. 5), the techniques may enable video decoder 30 to have lower complexity relative to other systems when decoding the encoded data using the context adaptive entropy coding process. For example, the techniques may reduce an amount of information stored within video decoder 30 and/or transmitted from a video encoder (e.g., video encoder 20) to video decoder 30 for purposes of initializing one or more contexts of the context adaptive entropy coding process. In particular, the amount of information may be reduced by storing and/or transmitting initialization parameter index values that indicate initialization parameters used to initialize the contexts, rather than storing and/or transmitting the initialization parameters directly.

In a similar manner as described above with reference to FIG. 2, in some examples, the amount of information may be reduced by defining the initialization parameter index values such that the initialization parameter index values are represented using less information than the initialization parameters. As a result, the initialization parameter index values may correspond to only a subset of the initialization parameters. In this manner, fewer than all of the initialization parameters, as indicated by the initialization parameter index values, may be used to initialize the contexts. For example, some of the contexts may be initialized using common initialization parameters. Nevertheless, any adverse effects associated with using the subset of initialization parameters, rather than all of the initialization parameters (e.g., the initial probabilities of the contexts being relatively less accurate compared to initial probabilities determined using all of the initialization parameters, wherein each context is initialized using a unique one or more initialization parameter), may be outweighed by the reduced amount of information stored within video decoder 30, and, in some cases, transmitted from the video encoder to video decoder 30, as described above.

In this manner, in some examples, the initialization parameter index values indicating the subset of initialization parameters, and the subset of initialization parameters itself, may be stored within video decoder 30, thereby possibly reducing the amount of information stored within video decoder 30. For example, in some cases, because the initialization parameter index values may be represented using less information than the initialization parameters, and because the initialization parameter index values may correspond to only a subset of the initialization parameters, a total amount of information used to store the initialization parameter index values and the subset of initialization parameters within video decoder 30 may be reduced relative to an amount of information that would be required to store all of the initialization parameters within video decoder 30. Furthermore, in other cases, the initialization parameter index values, rather than the initialization parameters, may be transmitted from the video encoder to video decoder 30, thereby reducing a total amount of information transmitted from the video encoder to video decoder 30.

As another example, as will be shown by the examples of FIGS. 6-8, the techniques of this disclosure may improve compression of the data when a video encoder (e.g., video encoder 20) is configured to encode the data, and video decoder 30 is configured to decode the encoded data, using a context adaptive entropy coding process. For example, the techniques may improve the compression of the data by enabling video decoder 30, or any components thereof, to initialize one or more contexts of the context adaptive entropy coding process, such that the one or more contexts include relatively more accurate initial probabilities compared to initial probabilities determined using other context initialization techniques. Additionally, in some examples, the techniques may further improve the compression of the data by enabling video decoder 30, or any components thereof, to subsequently update the probabilities of the one or more contexts such that the updated probabilities are more accurate compared to probabilities updated using other context probability update techniques.

Accordingly, there may be a relative bit savings for a coded bitstream that includes the encoded data decoded by video decoder 30, or any components thereof, and, in some cases, the initialization parameter index values transmitted from a video encoder (e.g., video encoder 20) to video decoder 30, and a relative reduction in complexity of video decoder 30 used to decode the encoded data, when using the techniques of this disclosure.

In this manner, video decoder 30 represents an example of an apparatus for context adaptive entropy coding, the apparatus comprising a coder configured to determine one or more initialization parameters for a context adaptive entropy coding process based on one or more initialization parameter index values, determine one or more initial context states for initializing one or more contexts of the context adaptive entropy coding process based on the one or more initialization parameters, and initialize the one or more contexts of the context adaptive entropy coding process based on the one or more initial context states.

FIG. 4 is a conceptual diagram illustrating an example of a temporal hierarchy of a coded video sequence (CVS) coded using scalable video coding (SVC), consistent with the techniques of this disclosure. As shown in FIG. 4, a CVS may include a plurality of video frames, i.e., frames 1-8, arranged in a temporal order, which may be referred to as an output or "display" order. When the CVS is coded using SVC, as depicted in FIG. 4, some of the frames of the CVS, i.e., frames 0, 4, and 8, may be coded in a subset of the frames, which may be referred to as a "base layer" of the CVS, while other frames, i.e., frames 1-3 and 5-7, may be coded in one or more additional subsets of the frames of the CVS, each of which may be referred to as an "enhancement layer" of the CVS. For example, the base layer of the CVS may be transmitted and displayed on a display device. Additionally, one or more of the enhancement layers of the CVS may be selectively transmitted and displayed on the same display device, in conjunction with the base layer. In this manner, the CVS of FIG. 4 comprising the base layer and the one or more enhancement layers described above may be referred to as a CVS coded using SVC.

As illustrated by the example of FIG. 4, a particular video frame of a CVS that is coded using SVC may be coded in a hierarchical structure. As shown in FIG. 4, frames 0, 4, and 8 may be coded in a particular temporal layer (e.g., "layer 0"), frames 2 and 6 may be coded in another temporal layer (e.g., "layer 1"), and the remaining frames, i.e., frames 1, 3, 5, and 7, may be coded in yet another temporal layer (e.g., "layer 2"). In the example of FIG. 4, layer 0 may be referred to as a base layer, and each of layers 1 and 2 may be referred to as an enhancement layer. Furthermore, the dependency between the frames of FIG. 4 may not be symmetrical. In other words, frames coded in lower temporal layers (e.g., layer 0) may serve as reference frames for frames coded in higher temporal layers (e.g., layers 1 and 2), as indicated by the arrows shown in FIG. 4. Conversely, frames coded in higher temporal layers may not serve as reference frames for frames coded in lower temporal layers.

According to the techniques of this disclosure, a temporal layer associated with video data, such as, e.g., a video frame of a CVS coded using SVC, may be used to initialize one or more contexts of a context adaptive entropy coding process (e.g., a CABAC process) used to code the video data. For example, the temporal layer associated with the video data, which may be represented using a temporal layer parameter, may be used as part of determining initial context states for one or more contexts of the context adaptive entropy coding process, as described above with reference to FIGS. 1-3, and as will be described in greater detail below with reference to the example methods of FIGS. 5-8. In this manner, the techniques of this disclosure may, in some cases, enable initializing the one or more contexts such that initial probabilities indicated by the initial context states for the one or more contexts are relatively more accurate compared to initial probabilities determined using other techniques (e.g., techniques that do not take into account a temporal layer associated with video data when coding the video data using a context adaptive entropy coding process).

FIGS. 5-8 are flowcharts illustrating example methods of initializing one or more contexts and probabilities of a context adaptive entropy coding process, consistent with the techniques of this disclosure. In particular, the techniques of the example methods of FIGS. 5, 6, and 8 include determining initial context states for one or more contexts of a context adaptive entropy coding process (e.g., a CABAC process) used to code data (e.g., video data). Additionally, the techniques of the example method of FIG. 7 include determining initial probability values of one or more contexts of a context adaptive entropy coding process used to code data, as well as updating the initial probability values based on the data.

The techniques of FIGS. 5-8 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIGS. 5-8 are described with respect to entropy encoding unit 56 of video encoder 20 (FIG. 2) and/or entropy decoding unit 80 of video decoder 30 (FIG. 3), although it should be understood that other devices may be configured to perform similar techniques. Moreover, the steps illustrated in FIGS. 5-8 may be performed in a different order or in parallel, and additional steps may be added and certain steps omitted, without departing from the techniques of this disclosure. Additionally, consistent with the techniques of this disclosure, the techniques of the example methods of FIGS. 5-8 may be performed individually or in combination with one another, including performing one or more of the techniques of the example methods of FIGS. 5-8 sequentially or in parallel with one or more other techniques of the techniques of the example methods of FIGS. 5-8.

In the example of each of FIGS. 5-8, initially, entropy encoding unit 56 and/or entropy decoding unit 80 may receive a block of video data. For example, the block may comprise a macroblock, or a TU of a CU, as previously described. In some examples, entropy encoding unit 56 may encode the block of video data using a context adaptive entropy coding process (e.g., a CABAC process). Similarly, in other examples, in instances where the block is an encoded block of video data, entropy decoding unit 80 may decode the block using a same or a similar context adaptive entropy coding process as described above with reference to entropy encoding unit 56. In still other examples, entropy encoding unit 56 and/or entropy decoding unit 80 may encode or decode other types of data, e.g., data other than video data, using a context adaptive entropy coding process. In this manner, the example methods of FIGS. 5-8 may be applicable to any coding system that includes a video encoder, a video decoder, or any combination thereof, configured to code video data using a context adaptive entropy coding process. Additionally, the example methods of FIGS. 5-8 may be applicable to techniques for coding any of a wide variety of data, including data other than video data, using a context adaptive entropy coding process.

Figure 5:
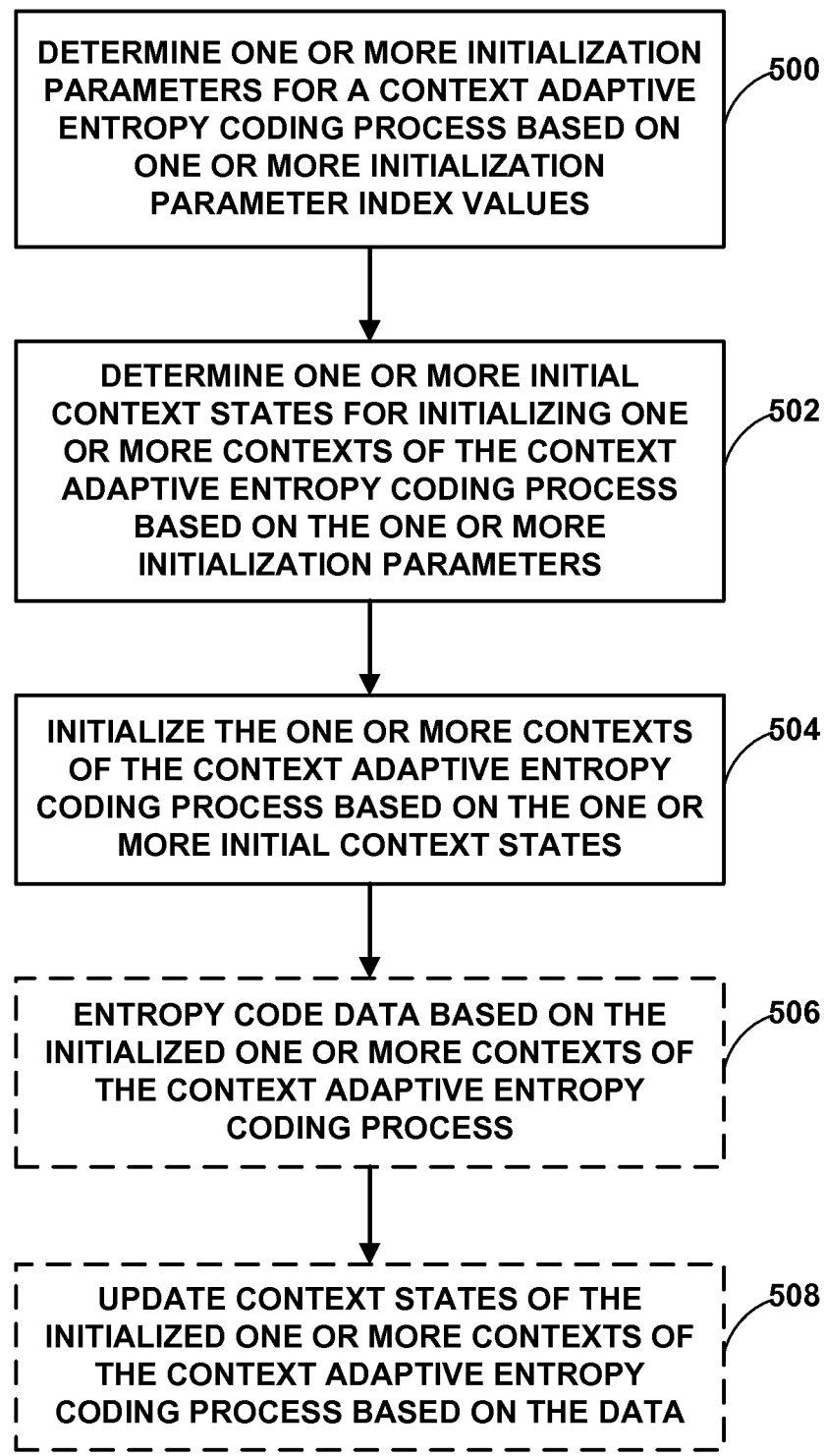
FIGS. 5-8 are flowcharts illustrating example methods of initializing one or more contexts and probabilities of a context adaptive entropy coding process, consistent with the techniques of this disclosure.

FIG. 5 is a flowchart that illustrates an example method of initializing one or more contexts of a context adaptive entropy coding process used to code data based on one or more initialization parameter index values, consistent with the techniques of this disclosure. In other words, the techniques of the example method of FIG. 5 include determining an initial context state for each of one or more contexts of a context adaptive entropy coding process used to code data using one or more initialization parameters, wherein the one or more initialization parameters are determined using one or more initialization parameter index values.

As one example, to code a block of video data, or other types of data, using a context adaptive entropy coding process (e.g., a CABAC process) as described above, entropy encoding unit 56 and/or entropy decoding unit 80 may determine one or more initialization parameters for the context adaptive entropy coding process based on one or more initialization parameter index values (500). For example, the one or more initialization parameters may correspond to one or more "m" and "n" parameters described above. As also described above, entropy encoding unit 56 and/or entropy decoding unit 80 may use values of the one or more "m" and "n" parameters to determine initial context states for contexts of the context adaptive entropy coding process, e.g., using the linear relationship described above with reference to H.264/AVC and certain draft versions of HEVC. Furthermore, according to the techniques of this disclosure, the one or more initialization parameter index values may be represented using less information (e.g., fewer bits of data) than an amount of information used to represent values of the one or more initialization parameters.

In one example, in cases where the one or more initialization parameters correspond to one or more "m" and "n" parameters, values of each of the one or more "m" and "n" parameters may be represented using 8 bits of data. As a result, in this example, 16 bits of data are used to represent each "m" and "n" parameter value "pair" used to initialize a particular context. As one example, in cases where each initialization parameter index value is used to determine a value of a particular one of the one or more "m" and "n" parameters, each initialization parameter index value may be represented using 4 bits of data, resulting in using 8 bits of data to determine each "m" and "n" parameter value pair. As another example, in cases where each initialization parameter index value is used to determine a particular "m" and "n" parameters value pair, each initialization parameter index value may be represented using 8 bits of data, once again resulting in using 8 bits of data to determine each "m" and "n" parameter value pair.

In this manner, rather than storing and/or transmitting 16 bits of data in order to initialize a particular context, only 8 bits of data are stored and/or transmitted. Furthermore, because the one or more initialization parameter index values may correspond to only a subset of all possible initialization parameters, fewer than all of the possible initialization parameters may be used to initialize the contexts. For example, some of the contexts may be initialized using common initialization parameters. Nevertheless, any adverse effects associated with using the subset of the initialization parameters, rather than all of the possible initialization parameters, may be outweighed by the reduced amount of information stored and/or transmitted, as described above.

Entropy encoding unit 56 and/or entropy decoding unit 80 may further determine one or more initial context states for initializing one or more contexts of the context adaptive entropy coding process based on the one or more initialization parameters (502). For example, as previously described, encoding unit 56 and/or entropy decoding unit 80 may determine the one or more initial context states based on the one or more initialization parameters using one or more relationships, such as, e.g., the linear relationship described above with reference to H.264/AVC and certain draft versions of HEVC.

Entropy encoding unit 56 and/or entropy decoding unit 80 may still further initialize the one or more contexts of the context adaptive entropy coding process based on the one or more initial context states (504). For example, as also previously described, encoding unit 56 and/or entropy decoding unit 80 may define a context state of a particular one of the one or more contexts as a corresponding one of the one or more initial context states. As also previously described, the initialized context state of the particular one of the one or more contexts may, in turn, indicate an initial probability of the context.

In some examples, entropy encoding unit 56 and/or entropy decoding unit 80 may further entropy code data (e.g., the block of video data, or other types of data) based on the initialized one or more contexts of the context adaptive entropy coding process (506). For example, entropy encoding unit 56 and/or entropy decoding unit 80 may code the data by performing the context adaptive entropy coding process based on the initialized one or more contexts described above. As previously described, the data may include video data, such as, e.g., a block of video data, and/or any other type of data. Additionally, in other examples, entropy encoding unit 56 and/or entropy decoding unit 80 may still further update context states of the initialized one or more contexts of the context adaptive entropy coding process based on the data (508). For example, entropy encoding unit 56 and/or entropy decoding unit 80 may update the initial probabilities of the initialized one or more contexts, as indicated by the one or more initial context states described above, based on the data (e.g., based on one or more values of the data).

In some examples, the one or more initialization parameters may be included in one or more tables. In these examples, to determine the one or more initialization parameters based on the one or more initialization parameter index values, entropy encoding unit 56 and/or entropy decoding unit 80 may map the one or more initialization parameter index values to the one or more initialization parameters in the one or more tables.

In other examples, to determine the one or more initialization parameters based on the one or more initialization parameter index values, entropy encoding unit 56 and/or entropy decoding unit 80 may calculate the one or more initialization parameters using the one or more initialization parameter index values and one or more formulas. For example, each of the one or more formulas may be implemented using only one or more operations each selected from a group consisting of a bit shift operation, an add operation, a subtract operation, a multiply operation, and a divide operation.

In still other examples, the one or more initialization parameters may include one or more slope values and one or more intersection values, and the one or more initialization parameter index values may include one or more slope index values and one or more intersection index values. In these examples, to determine the one or more initialization parameters based on the one or more initialization parameter index values, entropy encoding unit 56 and/or entropy decoding unit 80 may determine the one or more slope values based on the one or more slope index values, and determine the one or more intersection values based on the one or more intersection index values.

In some examples, the one or more initialization parameters may once again include one or more slope values and one or more intersection values. In these examples, to determine the one or more initialization parameters based on the one or more initialization parameter index values, entropy encoding unit 56 and/or entropy decoding unit 80 may determine at least one of the one or more slope values and at least one of the one or more intersection values based on a single one of the one or more initialization parameter index values. In other words, in some examples, each initialization parameter index value may be used to determine one or more slope values and one or more intersection values. As one example, each initialization parameter index value may be mapped to the one or more slope values and the one or more intersection values in one or more tables. As another example, each initialization parameter index value may be used to calculate the one or more slope values and the one or more intersection values based on one or more formulas. In other examples, however, each initialization parameter index value may include one or more components, or "subsets," that may be used to determine the one or more slope values and the one or more intersection values, as described in greater detail below.

For instance, in some examples, the single one of the one or more initialization parameter index values may include one or more slope index value components and one or more intersection index value components. In these examples, to determine the at least one of the one or more slope values and the at least one of the one or more intersection values based on the single one of the one or more initialization parameter index values, entropy encoding unit 56 and/or entropy decoding unit 80 may determine the at least one of the one or more slope values based on the one or more slope index value components, and determine the at least one of the one or more intersection values based on the one or more intersection index value components.

Furthermore, in other examples, to determine the at least one of the one or more slope values based on the one or more slope index value components, and determine the at least one of the one or more intersection values based on the one or more intersection index value components, entropy encoding unit 56 and/or entropy decoding unit 80 may determine one of the one or more slope index value components and the one or more intersection index value components of the single one of the one or more initialization parameter index values using one or more bit shift operations, and determine another one of the one or more slope index value components and the one or more intersection index value components of the single one of the one or more initialization parameter index values using one or more logical AND operations.

In still other examples, the single one of the one or more initialization parameter index values may include a predetermined number of bits, wherein each of the one or more slope index value components and the one or more intersection index value components includes a respective subset of the predetermined number of bits. In some examples, each of the subsets that correspond to the one or more slope index value components may include a different number of the predetermined number of bits than each of the subsets that correspond to the one or more intersection index value components. In other examples, each of the subsets that correspond to the one or more slope index value components may include a same number of the predetermined number of bits as each of the subsets that correspond to the one or more intersection index value components.

Additionally, in some examples, the one or more contexts of the context adaptive entropy coding process may include a subset of contexts of the context adaptive entropy coding process. For example, the subset may correspond to a syntax type associated with video data coded using the context adaptive entropy coding process. In some examples, the syntax type may include one or more of a component type, a block size, a transform size, a prediction mode, motion information, and transform coefficient information, associated with the video data.

In this manner, the method of FIG. 5 represents an example of a method of context adaptive entropy coding, the method comprising determining one or more initialization parameters for a context adaptive entropy coding process based on one or more initialization parameter index values, determining one or more initial context states for initializing one or more contexts of the context adaptive entropy coding process based on the one or more initialization parameters, and initializing the one or more contexts of the context adaptive entropy coding process based on the one or more initial context states.

FIG. 6 is a flowchart that illustrates an example method of initializing one or more contexts of a context adaptive entropy coding process used to code video data based on a temporal layer associated with video data, consistent with the techniques of this disclosure. In other words, the techniques of the example method of FIG. 6 include determining an initial context state for each of one or more contexts of a context adaptive entropy coding process used to code video data using one or more initialization parameters and a temporal layer parameter that is indicative of a temporal layer associated with the video data.

As one example, to code a block of video data, or other types of data, using a context adaptive entropy coding process (e.g., a CABAC process) as described above, entropy encoding unit 56 and/or entropy decoding unit 80 may determine one or more initial context states for initializing one or more contexts of a context adaptive entropy coding process used to code video data based on one or more initialization parameters and a temporal layer parameter associated with the video data (600). For example, the temporal layer parameter may correspond to a syntax element for the video data, wherein a value of the syntax element is indicative of a temporal layer associated with the video data. As described above with reference to FIG. 4, the temporal layer associated with the video data may correspond to a location of the video data (e.g., of a particular video frame of the video data) within a temporal hierarchy associated with the video data.

In this manner, initial probabilities of the one or more contexts, as indicated by the one or more initial context states, may be relatively more accurate compared to initial probabilities of contexts determined using other techniques, e.g., techniques that determine initial context states for contexts of a context adaptive entropy coding process used to code video data, without taking into account a temporal layer associated with the video data.

Subsequently, entropy encoding unit 56 and/or entropy decoding unit 80 may further initialize the one or more contexts of the context adaptive entropy coding process based on the one or more initial context states (602), as described above with reference to FIG. 5. Additionally, in some examples, entropy encoding unit 56 and/or entropy decoding unit 80 may further entropy code the video data based on the initialized one or more contexts of the context adaptive entropy coding process (604), and, in some cases, update context states of the initialized one or more contexts of the context adaptive entropy coding process based on the video data (606), in a similar manner as described above with reference to FIG. 5.

In some examples, the video data may include one of a frame of video data and a slice of a frame of video data. In these examples, the temporal layer parameter may include a temporal layer of the respective frame of video data.

In other examples, to determine the one or more initial context states based on the one or more initialization parameters and the temporal layer parameter, entropy encoding unit 56 and/or entropy decoding unit 80 may determine the one or more initial context states based on the one or more initialization parameters and one of an offset parameter that varies based on the temporal layer parameter, and an initialization quantization parameter value that varies based on the temporal layer parameter.

In some examples, to determine the one or more initial context states based on the one or more initialization parameters and the offset parameter, entropy encoding unit 56 and/or entropy decoding unit 80 may modify a quantization parameter value associated with the video data using the offset parameter. In other examples, each of one or more of the offset parameter and the initialization quantization parameter value may further vary based on one or more of a slice type, a frame resolution, and a reference frame list size associated with the video data. Furthermore, in some examples, entropy encoding unit 56 and/or entropy decoding unit 80 may further code one or more of the offset parameter and the initialization quantization parameter value to be included in at least one of a picture parameter set (PPS), a sequence parameter set (SPS), and an adaptation parameter set (APS) associated with the video data, e.g., or another parameter set or high level syntax location.

Additionally, in some examples, the one or more contexts of the context adaptive entropy coding process may include a subset of contexts of the context adaptive entropy coding process. As one example, the subset may correspond to a syntax type associated with the video data. As another example, the syntax type may include one or more of a component type, a block size, a transform size, a prediction mode, motion information, and transform coefficient information associated with the video data.

In this manner, the method of FIG. 6 represents an example of a method of context adaptive entropy coding, the method comprising determining one or more initial context states for initializing one or more contexts of a context adaptive entropy coding process used to code video data based on one or more initialization parameters and a temporal layer parameter associated with the video data, and initializing the one or more contexts of the context adaptive entropy coding process based on the one or more initial context states.

FIG. 7 is a flowchart that illustrates an example method of initializing one or more contexts of a context adaptive entropy coding process based on one or more probability offsets, consistent with the techniques of this disclosure. In other words, the techniques of the example method of FIG. 7 include determining an initial probability of each of one or more contexts of a context adaptive entropy coding process used to code data, such that the initial probability of each context is located within a subset of an overall probability value range defined by a lower bound and an upper bound. In the example method of FIG. 7, the subset is defined by one or more probability offsets relative to one or more of the lower bound and the upper bound of the probability value range.

As one example, to code a block of video data, or other types of data, using a context adaptive entropy coding process (e.g., a CABAC process) as described above, entropy encoding unit 56 and/or entropy decoding unit 80 may determine a first value (700). For example, the first value may correspond to an initial probability of a particular context of the context adaptive entropy coding process that is derived using a given context probability initialization technique. In this example, the initial probability of the context may correspond to a "default" initial probability, e.g., derived using the context probability initialization technique described above with reference to H.264/AVC and HEVC. Unlike other techniques, however, the techniques of the example method of FIG. 7 include determining whether a second value, different than the first value, may result in a relatively more accurate (e.g., less skewed) initial probability of the context, and, based on the determination, selecting the first value or the second value as the initial probability of the context.

For example, in the event the first value is within a range of values defined by a lower bound, an upper bound, and one or more offsets relative to one or more of the lower bound and the upper bound (702, "YES"), entropy encoding unit 56 and/or entropy decoding unit 80 may further select the first value (704). In the event the first value is outside of the range of values (702, "NO"), however, entropy encoding unit 56 and/or entropy decoding unit 80 may instead select a second value, wherein the second value is different than the first value (706). As explained above, the second value may correspond to a different probability of the context that is more accurate relative to the probability corresponding to the first value, and vice versa.

In this manner, the initial probability of the context may be relatively more accurate compared to an initial probability of a context determined using other techniques, e.g., techniques that determine an initial probability of a context of a context adaptive entropy coding process used to code data without taking into account a relative location of the initial probability within a probability value range. For example, according to some techniques, the initial probability of the context may be located relatively close to either of a lower bound and an upper bound of the probability value range, possibly resulting in the initial probability being inaccurate.

Subsequently, entropy encoding unit 56 and/or entropy decoding unit 80 may initialize a probability of a context of a context adaptive entropy coding process based on the selected first or second value (708). For example, entropy encoding unit 56 and/or entropy decoding unit 80 may initialize the probability of the context by defining the probability of the context as the selected first or second value.

In some examples, entropy encoding unit 56 and/or entropy decoding unit 80 may further entropy code data (e.g., the block of video data, or other types of data) based on the initialized probability of the context of the context adaptive entropy coding process (710). For example, entropy encoding unit 56 and/or entropy decoding unit 80 may code the data by performing the context adaptive entropy coding process based on the initialized probability described above, as well as based on one or more other probabilities of contexts initialized in a same or a similar manner as described above.

Additionally, in other examples, entropy encoding unit 56 and/or entropy decoding unit 80 may still further update the initialized probability of the context of the context adaptive entropy coding process based on the data and the one or more offsets (712). For example, entropy encoding unit 56 and/or entropy decoding unit 80 may update the initialized probability of the context based on the data (e.g., based on one or more values of the data), in a similar manner as described above with reference to FIGS. 5 and 6. Additionally, entropy encoding unit 56 and/or entropy decoding unit 80 may also update the initialized probability of the context based on the one or more offsets, such that the updated probability is also located within the previously described subset of the overall probability value range defined by the lower bound and the upper bound. In other words, in some examples, the techniques of the example method of FIG. 7 may be applicable to determining an initial probability of a particular context, as well as to continuously updating the probability of the context. In other examples, however, entropy encoding unit 56 and/or entropy decoding unit 80 may update the initialized probability of the context based on the data alone, in a similar manner as described above with reference to FIGS. 5 and 6.

In some examples, the one or more offsets may include a first offset and a second offset. In these examples, to select the first value in the event the first value is within the range of values, entropy encoding unit 56 and/or entropy decoding unit 80 may select the first value if the first value is greater than a value of the lower bound plus the first offset and less than a value of the upper bound minus the second offset. In some examples, the first offset may be equal to the second offset. In other examples, the first offset may be different than the second offset.

In still other examples, entropy encoding unit 56 and/or entropy decoding unit 80 may further update the probability of the context of the context adaptive entropy coding process based on the one or more offsets, as already described above.

In this manner, the method of FIG. 7 represents an example of a method of context adaptive entropy coding, the method comprising determining a first value, in the event the first value is within a range of values defined by a lower bound, an upper bound, and one or more offsets relative to one or more of the lower bound and the upper bound, selecting the first value, in the event the first value is outside of the range of values, selecting a second value, wherein the second value is different than the first value, and initializing a probability of a context of a context adaptive entropy coding process based on the selected first or second value.

FIG. 8 is a flowchart that illustrates an example method of initializing one or more contexts of a context adaptive entropy coding process based on reference context state and quantization parameter values and one or more relationships, consistent with the techniques of this disclosure. In other words, the techniques of the example method of FIG. 8 include determining an initial context state for each of one or more contexts of a context adaptive entropy coding process used to code video data using three or more sets of values each including a reference context state value and a corresponding reference quantization parameter value, and one or more relationships.

As one example, to code a block of video data, or other types of data, using a context adaptive entropy coding process (e.g., a CABAC process) as described above, entropy encoding unit 56 and/or entropy decoding unit 80 may determine an initial context state for initializing a context of a context adaptive entropy coding process used to code video data based on an initialization parameter that defines three or more reference context states each corresponding to a respective one of three or more reference quantization parameter values and a quantization parameter value associated with the video data (800). For example, the three or more reference context states and the corresponding three or more reference quantization parameter values may be predetermined three or more sets, or "pairs," of values, each including a reference context state value and a corresponding reference quantization parameter value. As one example, the reference context state value of each pair may be derived prior to performing step (800) using the corresponding reference quantization parameter value of the respective pair, and one or more relationships. In some examples, the one or more relationships may include, e.g., the linear relationship described above with reference to H.264/AVC and certain draft versions of HEVC, the relationship used in the example method of FIG. 6 that takes into account a temporal layer associated with the video data, or any other relationship used to determine a context state for a context based on a quantization parameter value. Additionally, the quantization parameter value associated with the video data may be a quantization parameter value associated with one or more frames, slices, blocks, or other portions of the video data.

In this manner, an initial probability of the context, as indicated by the initial context state, may be relatively more accurate compared to an initial probability of a context determined using other techniques, e.g., techniques that determine initial context states for contexts of a context adaptive entropy coding process used to code video data using a linear relationship defined by slope and intersection values, and by a quantization parameter associated with the video data. One example of such a linear relationship was described above with reference to H.264/AVC and certain draft versions of HEVC. According to the techniques of the example method of FIG. 8, the initial probability of the context may be derived using the initialization parameter and the quantization parameter value associated with the video data along with various (e.g., linear and non-linear) interpolation techniques, which may result in the initial probability of the context being relatively more accurate.

Subsequently, entropy encoding unit 56 and/or entropy decoding unit 80 may initialize the context of the context adaptive entropy coding process based on the initial context state (802), in a similar manner as described above with reference to FIGS. 5 and 6. Additionally, in some examples, entropy encoding unit 56 and/or entropy decoding unit 80 may further entropy code the video data based on the initialized context of the context adaptive entropy coding process (804), and, in some cases, update a context state of the initialized contexts of the context adaptive entropy coding process based on the video data (806), also in a similar manner as described above with reference to FIGS. 5 and 6.

In some examples, to determine the initial context state based on the initialization parameter and the quantization parameter value associated with the video data, entropy encoding unit 56 and/or entropy decoding unit 80 may interpolate linearly among the three or more reference context states and the corresponding three or more reference quantization parameter values using the quantization parameter value associated with the video data. For example, entropy encoding unit 56 and/or entropy decoding unit 80 may use linear or any partially-linear interpolation techniques to determine the initial context state based on the initialization parameter and the quantization parameter value associated with the video data.

In other examples, to determine the initial context state based on the initialization parameter and the quantization parameter value associated with the video data, entropy encoding unit 56 and/or entropy decoding unit 80 may fit a curve among the three or more reference context states and the corresponding three or more reference quantization parameter values, and interpolate among the three or more reference context states and the corresponding three or more reference quantization parameter values using the fitted curve and the quantization parameter value associated with the video data. For example, entropy encoding unit 56 and/or entropy decoding unit 80 may use spline-based, bi-linear, or any non-linear or partially non-linear interpolation techniques to determine the initial context state based on the initialization parameter and the quantization parameter value associated with the video data.

Additionally, in still other examples, each of the three or more reference quantization parameter values may be offset relative to another one of the three or more reference quantization parameter values by a value that is an integer multiple of "2." For example, as described above, a first reference quantization parameter value, e.g., "QP1," may equal "26," a second reference quantization parameter value, e.g., "QP2," may equal "QP1−8," or "18," and a third reference quantization parameter value, "QP3," may equal "QP1+8," or "34." In this example, each of the reference quantization parameter values QP1, QP2, and QP3 are offset relative to one another by a value that is an integer multiple of "2," in this case, "8." In other examples, each of the three or more reference quantization parameter values may be offset relative to one another by any other value, including any other value that is an integer multiple of "2."

In this manner, the method of FIG. 8 represents an example of a method of context adaptive entropy coding, the method comprising determining an initial context state for initializing a context of a context adaptive entropy coding process used to code video data based on an initialization parameter that defines three or more reference context states each corresponding to a respective one of three or more reference quantization parameter values, and a quantization parameter value associated with the video data, and initializing the context of the context adaptive entropy coding process based on the initial context state.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of initializing a context used to code video data in a context adaptive entropy coding process, the method comprising:
   determining a first initialization parameter index value as $x\!>\!>\!4$, where x is an 8-bit parameter;
   determining a second initialization parameter index value as x&15, where x is the same 8-bit parameter;
   setting a slope parameter of a linear model equal to an output of a first function, the first function being a linear function of the form c0*m+c1, where m is the first initialization parameter index value and c0 and c1 are parameters of the linear function;
   setting an intersection parameter of the linear model equal to an output of a second function, the second function being a function of the second initialization parameter index value; and
   initializing, based on the slope and intersection parameters, a state of the context used to code video data in the context adaptive entropy coding process.

2. The method of claim 1, wherein each of the first function and the second function is implemented using only one or more operations each selected from a group consisting of:
   a bit shift operation;
   an add operation;
   a subtract operation;
   a multiply operation; and
   a divide operation.

3. The method of claim 1, further comprising:
   encoding, based on the initialized context of the context adaptive entropy coding process, one or more syntax elements associated with a block of the video data; and
   outputting the encoded one or more syntax elements in a bitstream.

4. The method of claim 1, further comprising:
   receiving one or more encoded syntax elements associated with a block of the video data in a bitstream; and
   decoding, based on the initialized context of the context adaptive entropy coding process, the one or more encoded syntax elements.

5. The method of claim 1, wherein the first function is:

$$slope=m*5-45; \text{ and}$$

the second function is:

$$intersection=n*8-16,$$

wherein the slope and intersection terms are the slope and intersection parameters and the m and n terms are the first and second initialization parameter index values, respectively.

6. The method of claim 1, wherein the first initialization parameter index value includes a slope index value.

7. The method of claim 1, wherein the context adaptive entropy coding process is a Context Adaptive Binary Arithmetic Coding (CABAC) process.

8. An apparatus for performing a context adaptive entropy coding process, the apparatus comprising:
   a data storage medium configured to store video data; and
   a coder configured to:
      determine a first initialization parameter index value as $x\!>\!>\!4$, where x is an 8-bit parameter;
      determine a second initialization parameter index value as x&15, where x is the same 8-bit parameter;
      set a slope parameter of a linear model equal to an output of a first function, the first function being a linear function of the form c0*m+c1, where m is the first initialization parameter index value and c0 and c1 are parameters of the linear function;
set an intersection parameter of the linear model equal to an output of a second function, the second function being a function of the second initialization parameter index value; and
initialize, based on the slope and intersection, a state of a context used to code the video data in the context adaptive entropy coding process.

9. The apparatus of claim 8, wherein each of the first function and the second function is implemented using only one or more operations each selected from a group consisting of:
a bit shift operation;
an add operation;
a subtract operation;
a multiply operation; and
a divide operation.

10. The apparatus of claim 8, wherein the coder comprises a video encoder, and wherein the video encoder is further configured to:
encode, based on the initialized context of the context adaptive entropy coding process, one or more syntax elements associated with a block of the video data; and
output the encoded one or more syntax elements in a bitstream.

11. The apparatus of claim 8, wherein the coder comprises a video decoder, and wherein the video decoder is further configured to:
receive one or more encoded syntax elements associated with a block of the video data in a bitstream; and
decode the one or more encoded syntax elements based on the initialized context of the context adaptive entropy coding process.

12. The apparatus of claim 8, wherein the apparatus comprises at least one of:
an integrated circuit;
a microprocessor; and
a wireless communication device that includes the coder.

13. The apparatus of claim 8, wherein the function is:

$$slope = m*5-45; \text{ and}$$

the second function is:

$$intersection = n*8-16,$$

wherein the slope and intersection terms are the slope and intersection parameters and the m and n terms are the first and second initialization parameter index values, respectively.

14. The apparatus of claim 8, wherein the first initialization parameter index value includes a slope index value.

15. The apparatus of claim 8, wherein the context adaptive entropy coding process is a Context Adaptive Binary Arithmetic Coding (CABAC) process.

16. A device for performing a context adaptive entropy coding process, the device comprising:
means for determining a first initialization parameter index value as x>>4, where x is an 8-bit parameter;
means for determining a second initialization parameter index value as x&15, where x is the same 8-bit parameter;
means for setting a slope parameter of a linear model equal to an output of a first function, the first function being a linear function of the form c0*m+c1, where m is the first initialization parameter index value and c0 and c1 are parameters of the linear function;
means for setting an intersection parameter of the linear model equal to an output of a second function, the second function being a function of the second initialization parameter index value; and
means for initializing, based on the slope and intersection parameters, a state of the context used to code video data in the context adaptive entropy coding process.

17. The device of claim 16, wherein each of the first function and the second function is implemented using only one or more operations each selected from a group consisting of:
a bit shift operation;
an add operation;
a subtract operation;
a multiply operation; and
a divide operation.

18. The device of claim 16, further comprising:
means for encoding, based on the initialized context of the context adaptive entropy coding process, one or more syntax elements associated with a block of the video data; and
means for outputting the encoded one or more syntax elements in a bitstream.

19. The device of claim 16, further comprising:
means for receiving one or more encoded syntax elements associated with a block of the video data in a bitstream; and
means for decoding the one or more encoded syntax elements based on the initialized context of the context adaptive entropy coding process.

20. The device of claim 16, wherein the first function is:

$$slope = m*5-45; \text{ and}$$

the second function is:

$$intersection = n*8-16,$$

wherein the slope and intersection terms are the slope and intersection parameters and the m and n terms are the first and second initialization parameter index values, respectively.

21. The device of claim 16, wherein the first initialization parameter index value includes a slope index value.

22. The apparatus of claim 16, wherein the context adaptive entropy coding process is a Context Adaptive Binary Arithmetic Coding (CABAC) process.

23. A non-transitory computer-readable storage medium having stored thereon instructions that upon execution cause one or more processors to perform a context adaptive entropy coding process, wherein the instructions cause the one or more processors to:
determine a first initialization parameter index value as x>>4, where x is an 8-bit parameter;
determine a second initialization parameter index value as x&15, where x is the same 8-bit parameter;
set a slope parameter of a linear model equal to an output of a first function, the first function being a linear function of the form c0*m+c1, where m is the first initialization parameter index value and c0 and c1 are parameters of the linear function;
set an intersection parameter of the linear model equal to an output of a second function, the second function being a function of the second initialization parameter index value; and
initialize, based on the slope and intersection parameters, a state of a context used to code video data in the context adaptive entropy coding process.

24. The non-transitory computer-readable storage medium of claim 23, wherein each of the first function and the second function is implemented using only one or more operations each selected from a group consisting of:
   a bit shift operation;
   an add operation;
   a subtract operation;
   a multiply operation; and
   a divide operation.

25. The non-transitory computer-readable storage medium of claim 23, further comprising instructions that cause the one or more processors to:
   encode, based on the initialized context of the context adaptive entropy coding process, one or more syntax elements associated with a block of the video data; and
   output the encoded one or more syntax elements in a bitstream.

26. The non-transitory computer-readable storage medium of claim 23, further comprising instructions that cause the one or more processors to:
   receive one or more encoded syntax elements associated with a block of the video data in a bitstream; and
   decode the one or more encoded syntax elements based on the initialized context of the context adaptive entropy coding process.

27. The non-transitory computer readable storage medium of claim 23, wherein the first function is:

$$slope = m*5-45;$$ and the second function is:

$$intersection = n*8-16,$$

wherein the slope and intersection terms are the slope and intersection parameters and the m and n terms are the first and second initialization parameter index values, respectively.

28. The non-transitory computer-readable storage medium of claim 23, wherein the first initialization parameter index value includes a slope index value.

29. The non-transitory computer-readable storage medium of claim 23, wherein the context adaptive entropy coding process is a Context Adaptive Binary Arithmetic Coding (CABAC) process.

* * * * *